United States Patent
Xian et al.

(10) Patent No.: US 12,368,436 B2
(45) Date of Patent: Jul. 22, 2025

(54) SEMICONDUCTOR DEVICE WITH COMMON DEEP N-WELL FOR DIFFERENT VOLTAGE DOMAINS AND METHOD OF FORMING SAME

(71) Applicants: TAIWAN SEMICONDUCTOR MANUFACTURING COMPANY, LTD., Hsinchu (TW); TSMC NANJING COMPANY, LIMITED, Jiangsu (CN)

(72) Inventors: Huaixin Xian, Hsinchu (TW); Zhang-Ying Yan, Hsinchu (TW); Qingchao Meng, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 479 days.

(21) Appl. No.: 17/721,275

(22) Filed: Apr. 14, 2022

(65) Prior Publication Data

US 2023/0290781 A1    Sep. 14, 2023

(30) Foreign Application Priority Data

Mar. 11, 2022    (CN) .......................... 202210241256.6

(51) Int. Cl.
*H03K 17/56* (2006.01)
*H03K 3/356* (2006.01)
(Continued)

(52) U.S. Cl.
CPC ....... *H03K 17/56* (2013.01); *H03K 3/356113* (2013.01); *H03K 19/003* (2013.01);
(Continued)

(58) Field of Classification Search
CPC ............ H03K 17/56; H03K 3/356113; H03K 19/003; H03K 19/0185
See application file for complete search history.

(56) References Cited

U.S. PATENT DOCUMENTS 7,260,442 B2    8/2007    Hwang et al.
7,683,696 B1 *  3/2010    Le ................... H03K 19/00315
                                                      327/535
(Continued)

FOREIGN PATENT DOCUMENTS

CN    105556667    5/2016
EP      3382757   10/2018
(Continued)

*Primary Examiner* — Karen Kusumakar
*Assistant Examiner* — Adam S Bowen
(74) *Attorney, Agent, or Firm* — Hauptman Ham, LLP

(57) ABSTRACT

A semiconductor device includes a first conductivity-type substrate, and a cell region including: a second conductivity type deep well; first and second non-deep wells having the second conductivity-type, the first and second non-deep wells being in corresponding first and second portions of the substrate, the first and second portions of the substrate being in the deep well; and first, second, third and fourth transistor-regions. The first and second transistor-regions are correspondingly in the first and second non-deep wells and include first conductivity-type first transistors. The third and fourth transistor-regions are in the third and fourth portions of the substrate which are in the deep well, and include second transistors having the second conductivity-type. The first transistor-region is configured for a first power domain. The second, third and fourth transistor-regions are configured for a second power domain that is different than the first power domain.

20 Claims, 12 Drawing Sheets

(51) Int. Cl.
  *H03K 19/003* (2006.01)
  *H03K 19/0185* (2006.01)
  *H10D 84/03* (2025.01)
  *H10D 89/10* (2025.01)

(52) U.S. Cl.
  CPC ... *H03K 19/00361* (2013.01); *H03K 19/0185* (2013.01); *H03K 19/018521* (2013.01); *H10D 84/038* (2025.01); *H10D 89/10* (2025.01); *H03K 19/018571* (2013.01)

(56) References Cited

U.S. PATENT DOCUMENTS

| | | | |
|---|---|---|---|
| 8,829,944 B1 * | 9/2014 | Miller | H03K 3/356104 |
| | | | 327/434 |
| 9,256,709 B2 | 2/2016 | Yu et al. | |
| 10,205,441 B1 * | 2/2019 | Abhishek | H03K 5/003 |
| 10,804,884 B1 * | 10/2020 | Tsai | H03K 19/018528 |
| 11,277,121 B1 * | 3/2022 | Goyal | H03K 3/356113 |
| 2014/0040838 A1 | 2/2014 | Liu et al. | |
| 2014/0167105 A1 | 6/2014 | Salcedo et al. | |
| 2015/0278429 A1 | 10/2015 | Chang | |
| 2016/0094226 A1 * | 3/2016 | Wang | H02J 9/061 |
| | | | 307/130 |
| 2020/0153240 A1 * | 5/2020 | Delshadpour | H02H 9/04 |
| 2021/0367576 A1 * | 11/2021 | Leung | H04B 15/06 |
| 2022/0103170 A1 * | 3/2022 | Liberti | H03K 17/567 |

FOREIGN PATENT DOCUMENTS

| | | |
|---|---|---|
| TW | 201717350 | 5/2017 |
| TW | 201824749 | 7/2018 |

\* cited by examiner

SEMICONDUCTOR DEVICE WITH COMMON DEEP N-WELL FOR DIFFERENT VOLTAGE DOMAINS AND METHOD OF FORMING SAME

PRIORITY

This application claims the priority of China Application No. 202210241256.6, filed Mar. 11, 2022, the contents of which are incorporated herein in their entirety.

BACKGROUND

Integrated circuits (ICs) sometimes include multiple portions corresponding to different power domains, e.g., a first portion configured for a first power domain and a second portion configured for a second power domain. In some cases, the first power domain includes a first power supply voltage level and the second power domain includes a second power supply voltage level different from the first power supply voltage level. A signal is propagated from the first portion to the second portion using a level shifter that shifts logical levels from the first power supply voltage level to the second power supply voltage level.

A level shifter in digital electronics, also referred to as a logic-level shifter or voltage level translator, is a circuit used to translate signals from one logic level or voltage domain to another. A level shifter facilitates compatibility between ICs with different voltage requirements, such as transistor-transistor logic (TTL) and complementary metal oxide semiconductor (CMOS), or the like. Level shifters are used to bridge domains between processors, logic, sensors, or the like.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1A:
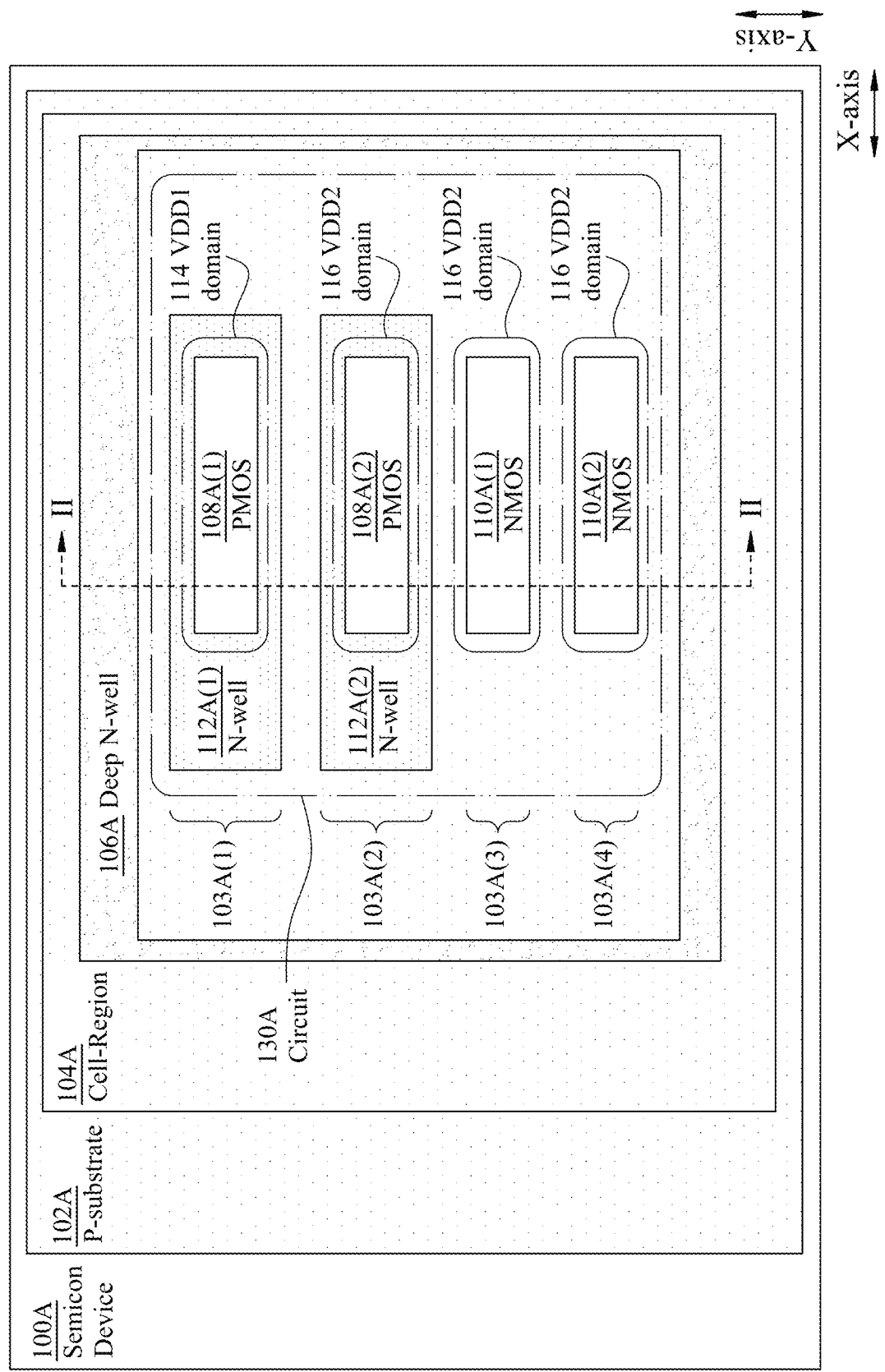
FIGS. 1A-1B are block diagrams of corresponding semiconductor devices, in accordance with some embodiments.

The following disclosure discloses many different embodiments, or examples, for implementing different features of the subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may further include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In some embodiments, the term "standard cell structure" refers to a standardized building block included in a library of various standard cell structures. In some embodiments, various standard cell structures are selected from a library thereof and are used as components in a layout diagram representing a circuit.

In some embodiments, a semiconductor device includes a substrate having a first conductivity-type (e.g., P-type) and a cell region. The cell region includes: a deep well having a second conductivity-type (e.g., N-type); first and second non-deep wells having the second conductivity-type (e.g., N-type), the first and second non-deep wells being in corresponding first and second portions of the substrate, the first and second portions of the substrate being in the deep well; and first, second, third and fourth transistor-regions. The first and second transistor-regions include first transistors having the first conductivity-type (e.g., P-type), the first and second transistor-regions being correspondingly in the first and second non-deep wells. The third and fourth transistor-regions including second transistors having the second conductivity-type (e.g., N-type), the third and fourth transistor-regions being corresponding in third and fourth portions of the substrate, the third and fourth portions of the substrate being in the deep well. The first transistor-region is configured for a first power domain having a first reference voltage VDD1. The second, third and fourth transistor-regions are configured for a second power domain having a second reference voltage VDD2. In some circumstances, VDD1<VDD2. In some circumstances, VDD2<VDD1. According to another approach, PMOS transistor regions configured for first (e.g., VDD1) and second (e.g., VDD2) power domains are in non-deep N-wells which are biased correspondingly to VDD1 and VDD2 and which must be separated from each other by a large gap, which wastes space. In contrast, some embodiments include not only the first and second non-deep wells but also the deep N-well, each of which is biased to the greater of VDD1 or VDD2, benefits of which include a substantially smaller gap between the first and second non-deep wells despite the first and second non-deep wells being configured correspondingly for the first and second power domains. As compared to the gap required by the other approach, the gap between the first and second non-deep wells is about 9 times (9×) smaller, which substantially reduces the area/footprint of cell region as compared to the cell region according to the other approach.

In some embodiments, a maximum voltage selector circuit is used to select and provide a voltage VPP equal to the greater of VDD1 or VDD2, e.g., to body-bias terminals of corresponding transistors in level shifters such as are disclosed herein, or the like. In some embodiments, the maximum voltage selector circuit includes: first and second active voltage dividers coupled between a first node and a second node, the first and second nodes having corresponding first and second reference voltages; the first active voltage divider including a control input configured to receive an output voltage of the second active voltage divider; the first active voltage divider further including an output configured to generate an output voltage; the second active voltage divider including a control input configured to receive the output voltage of the first active voltage divider; the second active voltage divider further including an output configured to generate an output voltage which represents an output voltage of the maximum voltage selector circuit; and the output voltage of the maximum voltage selector being the greater of the first reference voltage and the second reference voltage.

Figure 1B:
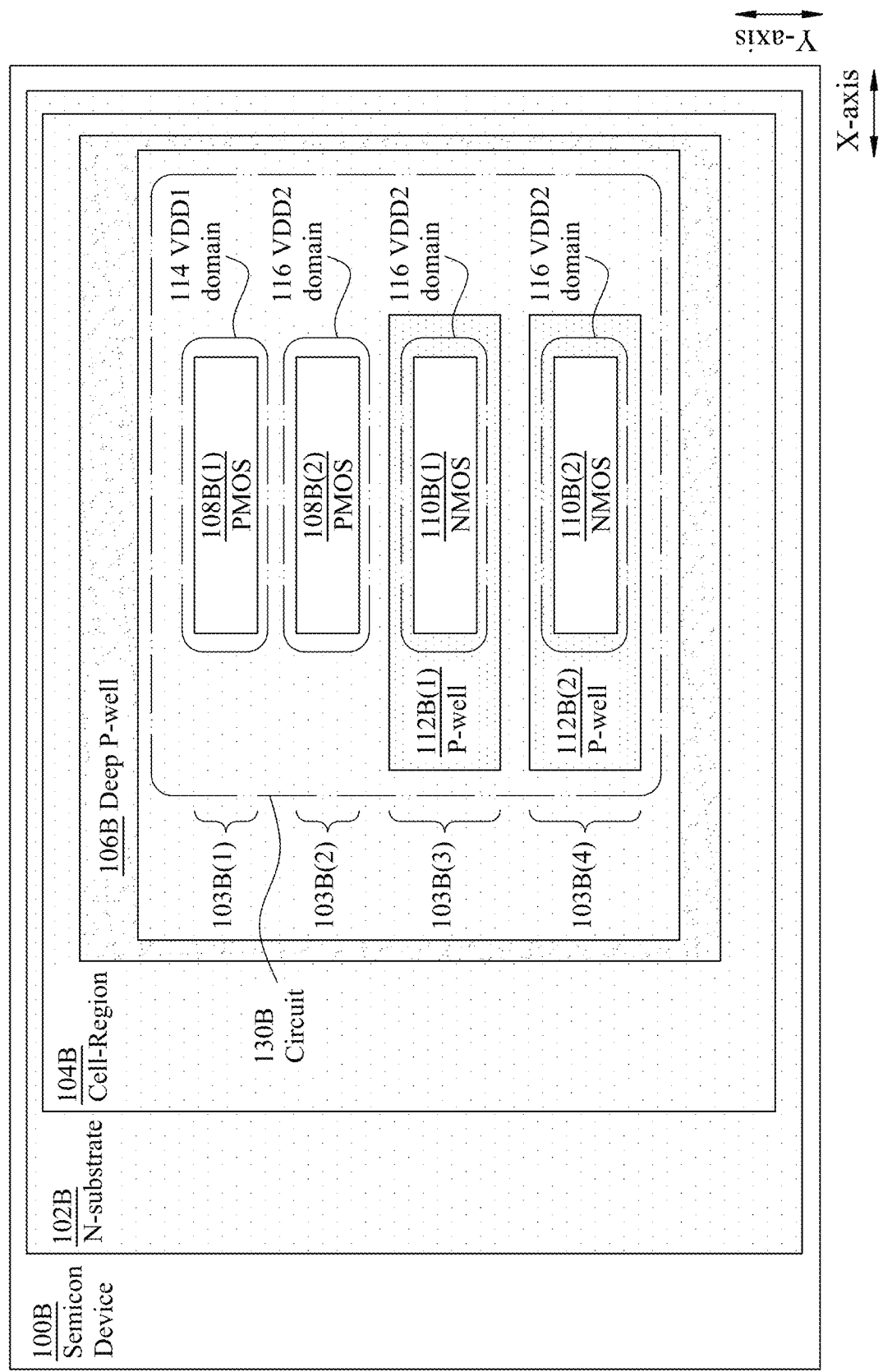

FIGS. 1A-1B are block diagrams of corresponding semiconductor devices, in accordance with some embodiments.

In FIG. 1A, a semiconductor device 100A includes a substrate 102A having a first conductivity-type (e.g., positive-channel type (P-type)) and a cell region 104A. Cell region 104A includes: a deep well 106A having a second conductivity-type (e.g., negative-channel type (N-type)); first 112A(1) and second 112A(2) non-deep wells having the second conductivity-type (N-type); and first 108A(1), second 108A(2), third 110A(1) and fourth 110A(2) transistor-regions. In some embodiments, non-deep wells 112A(1) and 112A(2) are wells of a standard depth whereas deep well 106A is a commensurately deeper well.

First transistor-region 108A(1) and second transistor-region 108A(2) are correspondingly in first non-deep well 112A(1) and second non-deep well 112A(2). First non-deep well 112A(1) and second non-deep well 112A(2) are in corresponding first 103A(1) and second 103A(2) portions of substrate 102A. First portion 103A(1) and second portion 103A(2) of substrate 102A are in deep well 106A. First transistor-region 108A(1) and second transistor-region 108A(2) include first transistors (see FIGS. 3A-3C) having the first conductivity-type (P-type).

Third transistor-region 110A(1) and fourth transistor-region 110A(2) correspondingly are in third portion 103A(3) and fourth portion 103A(4) of substrate 102A. Third portion 103A(3) and fourth portion 103A(4) of substrate 102A are in deep well 106A. Third transistor-region 110A(1) and fourth transistor-region 110A(2) include second transistors (see FIGS. 3A-3C) having the second conductivity-type (N-type).

Figure 3A:
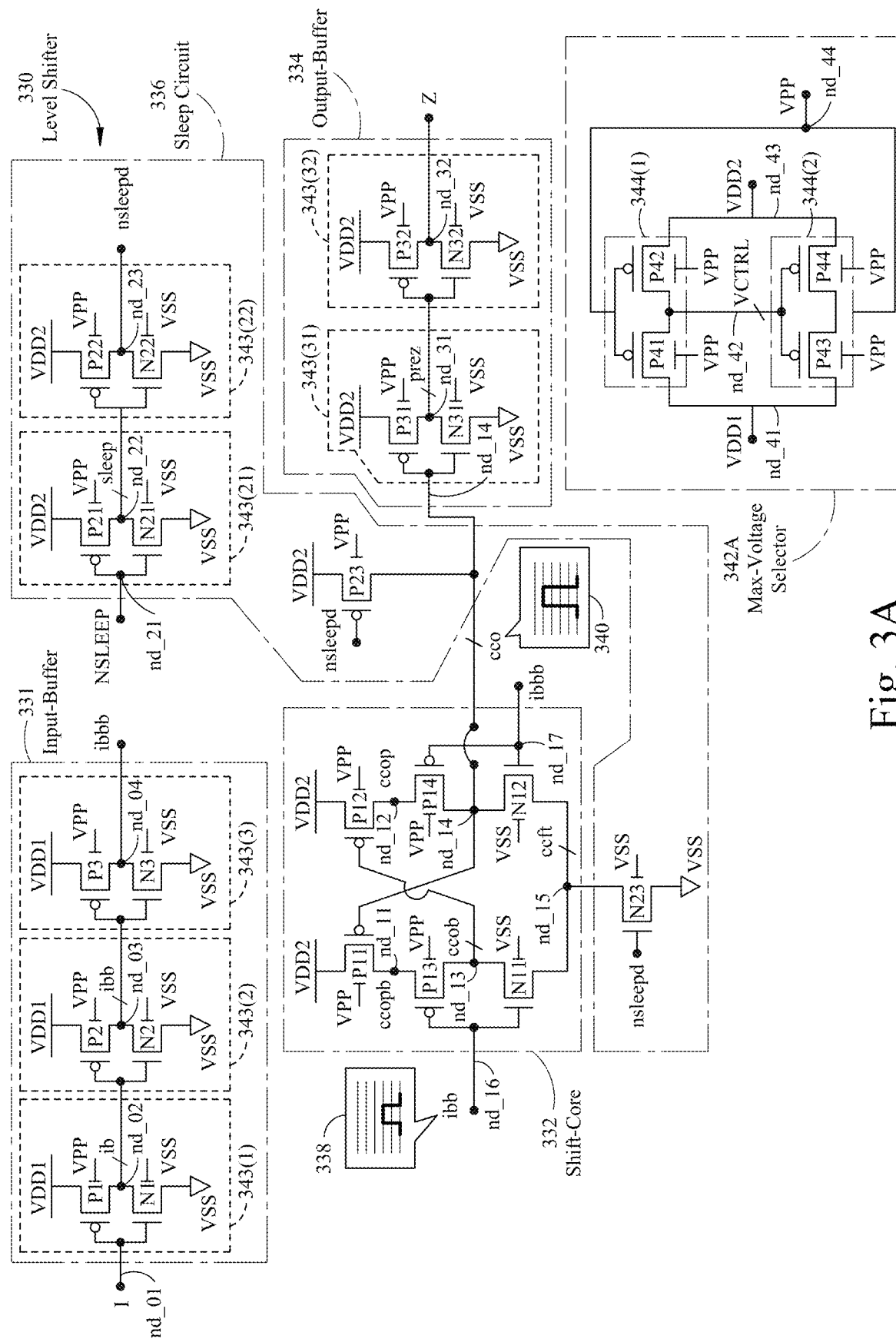
FIGS. 3A, 3B and 3C are corresponding circuit diagrams, in accordance with some embodiments.
Figures 3B, 3C:
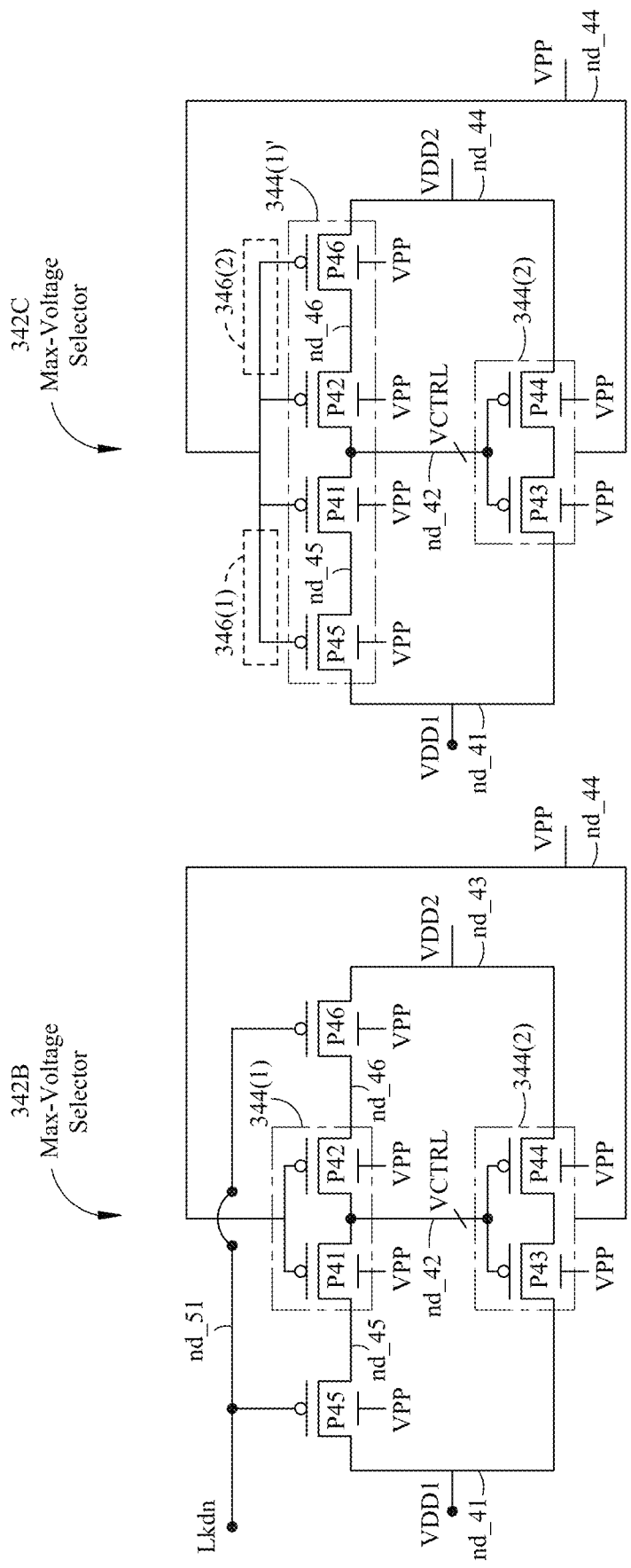

In combination, the first transistors correspondingly of first transistor-region 108A(1) and second transistor-region 108A(2) and the second transistors correspondingly of third transistor-region 110A(1) and fourth transistor-region 110A(2) comprise a circuit 130A, e.g., a level-shifter (see FIGS. 3A-3C).

First transistor-region 108A(1) is configured for a first power domain 114 (e.g., VDD1). Second transistor-region 108A(2), third transistor-region 110A(1) and fourth transistor-region 110A(2) are configured for a second power domain 116 (e.g., VDD2) that is different than the first power domain (e.g., VDD1). Deep N-well 106A and each of non-deep wells 112A(1) and 112A(2) are biased to the greater of VDD1 or VDD2. According to another approach, PMOS transistor regions configured for first (e.g., VDD1) and second (e.g., VDD2) power domains are in non-deep N-wells which are biased correspondingly to VDD1 and VDD2 and which must be separated from each other by a large gap, which wastes space. In contrast, embodiments such as cell region 104A include not only non-deep wells 112A(1) and 112A(2) but also deep N-well 106A, each of which is biased to the greater of VDD1 or VDD2, benefits of which include a substantially smaller gap between non-deep wells 112A(1) and 112A(2) despite non-deep wells 112A(1) and 112A(2) being configured correspondingly for the first and second power domains. As compared to the gap required by the other approach, the gap between non-deep wells 112A(1) and 112A(2) is about 9 times (9×) smaller, which substantially reduces the area/footprint of cell region 104A as compared to the cell region according to the other approach.

FIG. 1B is similar to FIG. 1A except that FIG. 1B shows a counterpart doping scheme as compared to FIG. 1A.

In FIG. 1B, a semiconductor device 100B includes a substrate 102B having a first conductivity-type (e.g., N-type) and a cell region 104B. Cell region 104B includes: a deep well 106B having a second conductivity-type (e.g., P-type); first 112B(1) and second 112B(2) non-deep wells having the second conductivity-type (P-type); and first 108B(1), second 108B(2), third 110B(1) and fourth 110B(2) transistor-regions. In some embodiments, non-deep wells 112B(1) and 112B(2) are wells of a standard depth whereas deep well 106B is a commensurately deeper well.

First transistor-region 108B(1) and second transistor-region 108B(2) are in corresponding first 103B(1) and second 103B(2) portions of substrate 102B. First portion 103B(1) and second portion 103B(2) of substrate 102B are in deep well 106B. First transistor-region 108B(1) and second transistor-region 108B(2) include first transistors (see FIGS. 3B-3C) having the second conductivity-type (P-type).

Third transistor-region 110B(1) and fourth transistor-region 110B(2) correspondingly are in first non-deep well 112B(1) and second non-deep well 112B(2). First non-deep well 112B(1) and second non-deep well 112B(2) are in corresponding third portion 103B(3) and fourth portion 103B(4) of substrate 102B. First non-deep well 112B(1) and second non-deep well 112B(2) are in deep well 106B. Third transistor-region 110B(1) and fourth transistor-region 110B(2) include second transistors (see FIGS. 3B-3C) having the first conductivity-type (N-type).

In combination, the first transistors correspondingly of first transistor-region 108B(1) and second transistor-region 108B(2) and the second transistors correspondingly of third transistor-region 110B(1) and fourth transistor-region 110B(2) comprise a circuit 130B, e.g., a level-shifter (see FIGS. 3A-3C).

First transistor-region 108B(1) is configured for a first power domain 114 (e.g., VDD1). Second transistor-region 108B(2), third transistor-region 110B(1) and fourth transistor-region 110B(2) are configured for a second power domain 116 (e.g., VDD2) that is different than the first power domain (VDD1). Deep N-well 106B and each of non-deep wells 112B(1) and 112B(2) are biased to the greater of VDD1 or VDD2. Embodiments such as cell region 104B include not only non-deep wells 112B(1) and 112B(2) but also deep N-well 106B, each of which is biased to the greater of VDD1 or VDD2, benefits of which include a substantially smaller gap between non-deep wells 112A(1) and 112A(2) despite non-deep wells 112A(1) and 112A(2) being configured correspondingly for the first and second power domains. As compared to the gap required by the other approach, the gap between non-deep wells 112B(1) and 112B(2) is about 9 times (9×) smaller, which substantially reduces the area/footprint of cell region 104B as compared to the cell region according to the other approach.

Figure 2:
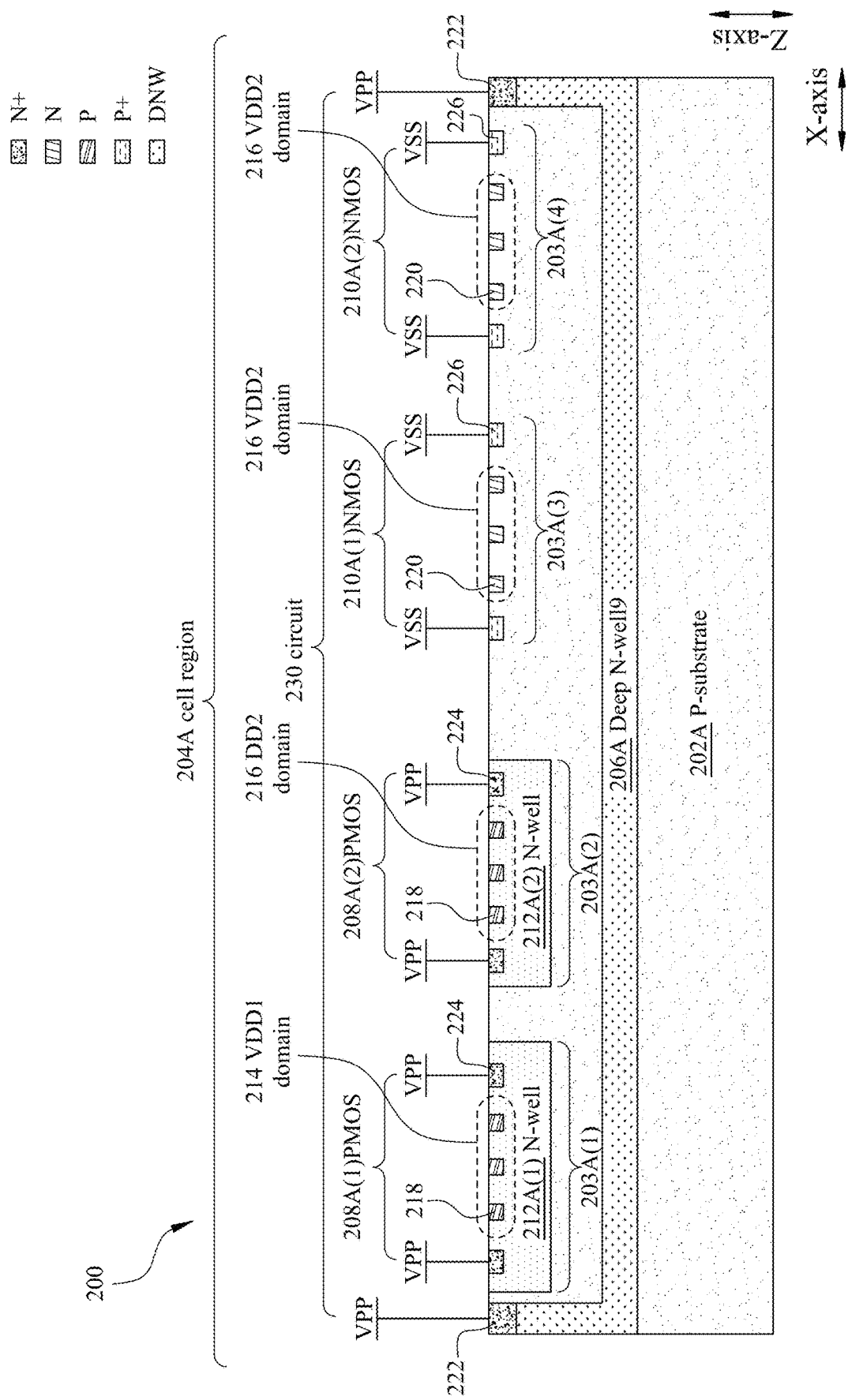
FIG. 2 is a cross-section of a semiconductor device, in accordance with some embodiments.

FIG. 2 is a cross-section of a semiconductor device 200, in accordance with some embodiments.

Semiconductor device 200 is an example of semiconductor device 100A as viewed along section line II-II' of FIG. 1A.

In FIG. 2, semiconductor device 200 includes a substrate 202A having positive-channel (P-type) conductivity and a cell region 204A. Cell region 204A includes: a deep well 206A having negative-channel (N-type) conductivity; first 212A(1) and second 212A(2) non-deep wells having N-type conductivity; and first 208A(1), second 208A(2), third 210A(1) and fourth 210A(2) transistor-regions. In some embodiments, non-deep N-wells 212A(1) and 212A(2) are N-wells of a standard depth whereas deep N-well 206A is a commensurately deeper N-well.

First transistor-region 208A(1) and second transistor-region 208A(2) are correspondingly in first non-deep N-well 212A(1) and second non-deep N-well 212A(2). First non-deep N-well 212A(1) and second non-deep N-well 212A(2) are in corresponding first 203A(1) and second 203A(2) portions of substrate 202A. First portion 203A(1) and second portion 203A(2) of substrate 202A are in deep N-well 206A. First transistor-region 208A(1) and second transistor-region 208A(2) include first transistors (see FIGS. 3A-3C) having the first conductivity-type (P-type).

Third transistor-region 210A(1) and fourth transistor-region 210A(2) correspondingly are in third portion 203A(3) and fourth portion 203A(4) of substrate 202A. Third portion 203A(3) and fourth portion 203A(4) of substrate 202A are in deep N-well 206A. Third transistor-region 210A(1) and fourth transistor-region 210A(2) include second transistors (see FIGS. 3A-3C) having the second conductivity-type (N-type).

FIG. 2 assumes that cell region 204A embodies fin-type field-effect transistor (fin-FET) technology. Accordingly, first transistor-region 208A(1) and second transistor-region 208A(2) correspondingly include P-type fins 218, and third transistor-region 210A(1) and fourth transistor-region 210A(2) correspondingly include of N-type fins 220. In some embodiments, cell region 204A embodies a transistor technology other than fin-FET technology, e.g., planar transistor technology, or the like.

In combination, the first transistors correspondingly of first transistor-region 208A(1) and second transistor-region 208A(2) and the second transistors correspondingly of third transistor-region 210A(1) and fourth transistor-region 210A(2) comprise a circuit 230A, e.g., a level-shifter (see FIGS. 3A-3C).

First transistor-region 208A(1) is configured for a first power domain 214 (e.g., VDD1). Second transistor-region 208A(2), third transistor-region 210A(1) and fourth transistor-region 210A(2) are configured for a second power domain 216 (e.g., VDD2) that is different than the first power domain (VDD1).

Embodiments such as cell region 204A include not only non-deep N-wells 212A(1) and 212A(2) but also deep N-well 206A, each of which is biased to the greater of VDD1 or VDD2, which is referred to as VPP in FIG. 2. Deep N-well 206A includes N+ substrate taps 222 which are coupled to VPP. First transistor-region 208A(1) and second transistor-region 208A(2) include corresponding N+ substrate taps 224 which are coupled to VPP. Third transistor-region 210A(1) and fourth transistor-region 210A(2) include corresponding P+ substrate taps 226 which are coupled to a low reference voltage common to the first and second power domains, e.g., VSS.

Benefits of biasing deep N-well 206A and each of non-deep N-wells 212A(1) and 212A(2) to the greater of VDD1 or VDD2, i.e., to VPP, include a substantially smaller gap between non-deep N-wells 212A(1) and 212A(2) despite non-deep N-wells 212A(1) and 212A(2) being configured correspondingly for the first and second power domains. As compared to the gap required by the other approach, the gap between non-deep N-wells 212A(1) and 212A(2) is about 9 times (9×) smaller, which substantially reduces the area/footprint of cell region 204A as compared to the cell region according to the other approach.

FIGS. 3A, 3B and 3C are corresponding circuit diagrams, in accordance with some embodiments.

More particularly, the circuit diagram of FIG. 3A is of a level shifter 330 which includes, among other things, a maximum (max) voltage selector 342A. FIGS. 3B and 3C show corresponding max voltage selectors 342B and 342C, which are variations of max voltage selector 342A.

Level shifter 330 is an example of circuit 130A of FIG. 1A or circuit 230 of FIG. 2, or the like. In addition to max voltage selector 342A, level shifter 330 includes: an input buffer 331; a shift-core 332; an output buffer 334; and a sleep circuit 336. Max voltage selector 342A will be discussed before input buffer 331, shift-core 332, output buffer 334 and a sleep circuit 336.

In FIG. 3A, max voltage selector 342A includes PMOS transistors P41, P42, P43 and P44. Series-coupled transistors P41 & P43 are coupled in parallel with series-coupled transistors P42 & P44 between a node nd_41 having the reference voltage of the first power domain, namely VDD1, and a node nd_43 having the reference voltage of the second power domain, namely VDD2. More particularly, transistor P41 is coupled between node nd_41 and a node nd_42, where node nd_42 has a control voltage VCTRL. Transistor P42 is coupled between node nd_42 and node nd_43. Transistor P43 is coupled between node nd_41 and a node nd_44. Node nd_44 has an output voltage VPP of max voltage selector 342A. Transistor P44 is coupled between node nd_44 and node nd_43. Gate terminals of transistors P41 and P42 are coupled to node nd_44. Gate terminals of transistors P43 and P44 are coupled to node nd_42.

Max voltage selector circuit 342A operates to select and output the greater of VDD1 and VDD2. In a first circumstance in which VDD1<VDD2, current flows in max voltage selector circuit 342A from node nd_43 through transistor P42 to node nd_42, and from node nd_42 through transistor P41 to node nd_41, which causes VCTRL to be VDD1<VCTRL<VDD2. When VDD1<VCTRL<VDD2, P43 turns off because VDD1<VCTRL and P44 turns on because VCTRL<VDD2, which transfers VDD2 onto node nd_44 such that VPP=VDD2. Recalling that VPP is coupled to the gate terminals of each of transistors P41 and P42, neither P41 nor P42 is turned on under the first circumstance because the gate terminal of each of transistors P41 and P42 receives VPP=VDD2 where VDD1<(VPP=VCTRL). Nevertheless, a leakage current flows from node nd_43 through each of transistors P42 and P41 to node nd_41 such that VDD1<VCTRL<VDD2; in this respect, transistors P41 and P42 behave as resistors.

Regarding max voltage selector 342A, in a second circumstance in which VDD2<VDD1, current flows in max voltage selector circuit 342A from node nd_41 through transistor P41 to node nd_42, and from node nd_42 through transistor P42 to node nd_43, which causes VCTRL to be VDD2<VCTRL<VDD1. When VDD2<VCTRL<VDD1, P43 turns ON because VCTRL<VDD1 and P44 turns OFF because VDD2<VCTRL, which transfers VDD1 onto node nd_44 such that VPP=VDD1. Recalling that VPP is coupled to the gate terminals of each of transistors P41 and P42, neither P41 nor P42 is turned on under the second circumstance because the gate terminal of each of transistors P41 and P42 receives VPP=VDD1 where VDD2< (VPP=VCTRL). Nevertheless, a leakage current flows from node nd_41 through each of transistors P41 and P42 to node nd_43 such that VDD1<VCTRL<VDD2.

In max voltage selector 342A, the series coupling of transistors P41 & P42 represents a first voltage divider 344(1) between VDD1 and VDD2. The series coupling of transistors P43 & P44 represents a second voltage divider 344(2) between VDD1 and VDD2. First voltage divider 344(1) and second voltage divider 344(2) are coupled in parallel between node nd_41 and nd_43.

More particularly, first voltage divider 344(1) is an active voltage divider because it includes active components, namely transistors P41 and P42. First active voltage divider 344(1) further includes a control input represented by the gate terminals of transistors P41 and P42, which are coupled together. The control input of first active voltage divider 344(1) receives voltage VPP. From node nd_42, first active voltage divider 344(1) outputs control voltage VCTRL. Similarly, second voltage divider 344(2) is an active voltage divider because it includes active components, namely transistors P43 and P44. Second active voltage divider 344(2) includes a control input represented by the gate terminals of transistors P43 and P44, which are coupled together. The control input of second active voltage divider 344(2) receives control voltage VCTRL. From node nd_44, second active voltage divider 344(2) outputs VPP.

In FIG. 3A, input buffer 331 includes PMOS transistors P1-P3 and NMOS transistors N1-N3. Transistors P1-P3 and N1-N3 are arranged as corresponding inverters 343(1)-343(3). More particularly, inverter 343(1) includes transistors P1 and N1 which are coupled in series between the reference voltage of the first power domain, namely VDD1, and VSS. The gate terminals of transistors P1 and N1 are coupled together and represent an input node nd_01 of inverter 343(1). Node nd_01 is configured to receive an input signal I that is input to level shifter 330. A node nd_02 represents an output node of inverter 343(1), and also represents an input node of inverter 343(2). Inverter 343(1) inverts input signal I as signal ib on node nd_02.

Inverter 343(2) includes transistors P2 and N2 which are coupled in series between VDD1 and VSS. The gate terminals of transistors P2 and N2 are coupled together and represent input node nd_02 of inverter 343(2). Node nd_02 is configured to receive signal ib from inverter 343(1). A node nd_03 represents an output node of inverter 343(2), and also represents an input node of inverter 343(3). Inverter 343(2) inverts signal ib as signal ibb on node nd_03.

Inverter 343(3) includes transistors P3 and N3 which are coupled in series between VDD1 and VSS. The gate terminals of transistors P3 and N3 are coupled together and represent input node nd_03 of inverter 343(3). Node nd_03 is configured to receive signal ibb from inverter 343(2). A node nd_04 represents an output node of inverter 343(3). Inverter 343(3) inverts signal ibb as signal ibbb on node nd_04.

In FIG. 3A, shift core 332 includes transistors PMOS P11-P14 and NMOS transistors N11-N12. Transistors P11, P13 and N11 are coupled in series between the reference voltage of the second power domain, namely VDD2, and a node nd_15. Also, transistors P12, P14 and N12 are coupled in series between VDD2 and node nd_15. More particularly, transistor P11 is coupled between VDD2 and a node nd_11, the latter having a signal ccopb. Transistor P13 is coupled between node nd_11 and a node nd_13, the latter having a signal ccob. Transistor N11 is coupled between node nd_13 and node nd_15, the latter having a signal ccft. Transistor P12 is coupled between VDD2 and a node nd_12, the latter having a signal ccop. Transistor P14 is coupled between node nd_06 and a node nd_14, the latter having a signal cco. Node nd_14 represents the output node of shift core 332 and an input node of output buffer 334.

In shift core 332, the gate of transistor P11 is cross-coupled to node nd_14. The gate of transistor P12 is cross-coupled to node nd_13. The gates of transistors P13 and N11 are coupled together and represent an input node nd_16 of shift core 332. Node nd_16 is configured to receive the signal ibb, the latter being output by input buffer 331 at node nd_03. The gates of transistors P14 and N12 are coupled together and represent a node nd_17. Node nd_17 is configured to receive the signal ibbb, the latter being output by input buffer 331 at node nd_04.

In operation, shift core 332 shifts input signal ibb on node nd_16, which has a lower level/magnitude, to output signal cco on node nd_14, which has a high level/magnitude. The lower level/magnitude of input signal ibb is simplistically represented by pictograph 338. The higher level/magnitude of output signal cco is simplistically represented by pictograph 340.

In FIG. 3A, output buffer 334 includes PMOS transistors P31-P32 and NMOS transistors N31-N32. Transistors P31-P32 and N31-N32 are arranged as corresponding inverters 343(31)-343(32). More particularly, inverter 343(31) includes transistors P31 and N31 which are coupled in series between VDD1 and VSS. The gate terminals of transistors P31 and N31 are coupled together and represent an input node of inverter 343(1) which happens to be node nd_14. Node nd_14 is configured to receive the output signal of shift core 332, namely signal cco. A node nd_31 represents an output node of inverter 343(31), and also represents an input node of inverter 343(32). Inverter 343(31) inverts signal cco as signal prez on node nd_31.

Inverter 343(32) includes transistors P32 and N32 which are coupled in series between VDD2 and VSS. The gate terminals of transistors P32 and N32 are coupled together and represent input node nd_31 of inverter 343(32). Node nd_31 is configured to receive signal prez from inverter 343(31). A node nd_32 represents an output node of inverter 343(32), and also represents the output node of level shifter 330. Inverter 343(32) inverts signal prez as signal Z on node nd_32, where Z represents the output signal of level shifter 330.

Sleep circuit 336 includes PMOS transistors P21-P23 and NMOS transistors N21-N23. Transistors P21-P22 and N21-N22 are arranged as corresponding inverters 343(21)-343(22). More particularly, inverter 343(21) includes transistors P21 and N21 which are coupled in series between VDD2 and VSS. The gate terminals of transistors P21 and N21 are coupled together and represent an input node nd_21 of inverter 343(1). Node nd_21 is configured to receive a power-saving signal NSLEEP. A node nd_22 represents an output node of inverter 343(21), and also represents an input node of inverter 343(22). Inverter 343(21) inverts signal NSLEEP as signal sleep on node nd_22.

Inverter 343(22) includes transistors P22 and N22 which are coupled in series between VDD2 and VSS. The gate terminals of transistors P22 and N22 are coupled together and represent input node nd_22 of inverter 343(23). Node nd_22 is configured to receive signal sleep from inverter 343(21). A node nd_23 represents an output node of inverter 343(22). Inverter 343(22) inverts signal sleep as signal nsleepd on node nd_23.

In sleep circuit 336, transistor P23 is coupled between VDD2 and node nd_14. The gate terminal of transistor P23 is coupled to signal nsleepd. Transistor N23 is coupled between node nd_15 and VSS. The gate terminal of transistor N23 is coupled to signal nsleepd. Among other things, when signal nsleepd is in a logical zero state, i.e., when signal nsleepd is low, transistor N23 is turned off, which prevents transistor N23 from conducting current. Of course, like any MOSFET in an off-state, transistor N23 suffers a leakage current. Nevertheless, the leakage current of transistor N23 is regarded as negligible for purposes of discussing sleep circuit 336. When transistor N23 is off, series-coupled transistors P11 & P13 & N11 are prevented from conducting current through node nd_15 to VSS via transistor N23. Similarly, when transistor N23 is off, series-coupled transistors P12 & P14 & N12 are prevented from conducting current through node nd_15 to VSS via transistor N23.

In level shifter 330, a body-bias terminal (also referred to as a bulk-bias terminal) of each of the NMOS transistors, i.e., of each of transistors N1-N3, N11-N12, N21-N23 and N31-N32, is coupled to the low reference voltage common to the first and second power domains, e.g., VSS. A body-bias terminal of each of the PMOS transistors, i.e., of each of transistors P1-P3, P11-P14, P21-P23, P31-P32 and P41-P44, is coupled to VPP because each of the PMOS transistors is in a corresponding one or more non-deep N-wells (not shown, but see FIGS. 1A and 2), the latter being in a deep N-well (not shown but see FIGS. 1A and 2).

Excluding body-biasing (also referred to as bulk-biasing), another approach for implementing a level shifter includes similar circuit-schematic counterparts to each of input buffer 331, shift-core 332, output buffer 334 and sleep circuit 336, but does not include a counterpart to max voltage selector 342A nor a counterpart to deep N-well (see FIGS. 1A and 2). Excluding body-biasing, the overall level-shifting operation of the level shifter according to the other approach is the same as the operation of level shifter 330. According to the other approach, the counterpart to input buffer 331 has PMOS transistors which are in a first non-deep N-well and which are configured for the first power domain such that body-bias terminals (also referred to as bulk-bias terminals) of the PMOS transistors in the first non-deep N-well are biased to VDD1. According to the other approach, the counterparts to shift-core 332, output buffer 334 and sleep circuit 336 have corresponding PMOS transistors which are in a second non-deep N-well and which are configured for the second power domain such that body-bias terminals of the PMOS transistors in the second non-deep N-well are biased to VDD2. A consequence of the other approach's biasing the first and second non-deep N-wells to different voltages is that the other approach's first and second non-deep wells must be separated from each other by a large gap, which wastes space. By contrast, in level shifter 330, the PMOS transistors, i.e., transistors P1-P3, P11-P14, P21-P23, P31-P32 and P41-P44, are in corresponding non-deep N-wells (not shown, but see 112A(1) and 112A(2) of FIG. 1A or 212A(1) or 221A(2) of FIG. 2), and wherein the non-deep N-wells are in a deep N-well (not shown but see 106A of FIG. 1A, or 206A of FIG. 2). As a beneficial result, a body-bias terminal of each of the PMOS transistors, i.e., of each of transistors P1-P3, P11-P14, P21-P23, P31-P32 and P41-P44, is coupled to VPP, where (again) VPP is provided by max voltage selector circuit 330 and VPP represents the greater of VDD1 and VDD2. As compared to the large gap required by the other approach, because the non-deep N-wells in a deep N-well and the non-deep N-wells and the deep N-well are biased to VPP according to some embodiments, the gap between the non-deep wells is about 9 times (9×) smaller, which substantially reduces the area/footprint of the corresponding cell region as compared to the cell region according to the other approach.

FIGS. 3B and 3C, again, show corresponding max voltage selectors 342B and 342C, which are variations of max voltage selector 342A.

In each of FIGS. 3B-3C, in addition to including PMOS transistors P41, P42, P43 and P44, each of max voltage selectors 342B and 342C further includes PMOS transistors P45 and P46. Series-coupled transistors P41 & P45 & P43 are coupled in parallel with series-coupled transistors P42 & P46 & P44 between node nd_41 which has VDD1 and node nd_43 which has VDD2. More particularly regarding transistors P41 & P45 & P43, transistor P41 is coupled between a node nd_45 and node nd_42. Transistor P45 is coupled between node nd_45 and node nd_41. Transistor P43 is coupled between node nd_41 and node nd_44. More particularly regarding transistors P42 & P46 & P44, transistor P42 is coupled between node nd_42 and a node nd_46. Transistor P46 is coupled between node nd_46 and node nd_43. Transistor P44 is coupled between node Nd_43 and node nd_44.

In FIG. 3B, gate terminals of transistors P45 and P46 are coupled to a node nd_51, which receives a signal Lkdn. Signal Lkdn is used to reduce leakage of max voltage selector 342B. In some embodiments, signal Lkdn is the same as signal sleep at node nd_22 of FIG. 3A.

In max voltage selector 342B, when signal Lkdn is in a logical high state, i.e., when signal Lkdn is high, each of transistors P45 and P46 is turned off, which prevents each of transistors P45 and P46 from conducting current. Of course, like any MOSFET in an off-state, each of transistors P45 and P46 suffers a leakage current. When transistors P45 and transistor P41 is turned on, current through the series-coupling of transistors P45 and P41 is limited by transistor P45 being off.

In FIG. 3B, when each of transistors P45 and P41 is turned off, only leakage current flows through the series-coupling of transistors P45 & P41. As compared the leakage current through transistor P41 in FIG. 3A wherein transistor P41 is coupled between nodes nd_41 and nd_42 without transistor P45, the leakage current through the series-coupling of transistors P45 & P41 between nodes nd_41 and nd_42 is smaller. The leakage current is smaller because transistors P45 and P41 in the off state represent corresponding resistors R_P45 and R_P41 coupled in series. The sum of the resistances R_P45 and R_P41 is greater than the resistance R_P41.

In max voltage selector 342B, when each of transistors P46 and P42 is turned off, only leakage current flows through the series-coupling of transistors P46 & P42. As compared the leakage current through transistor P42 in FIG. 3A wherein transistor P42 is coupled between nodes nd_42 and nd_44 without transistor P46, the leakage current through the series-coupling of transistors P46 & P42 between nodes nd_42 and nd_44 is smaller. The leakage current is smaller because transistors P46 and P42 in the off state represent corresponding resistors R_P46 and R_P42 coupled in series. The sum of the resistances R_P46 and R_P42 is greater than the resistance R_P42.

As compared to the current through transistor P41 when the same is on (on-current) in FIG. 3A, and recalling that transistor P41 is coupled between nodes nd_41 and nd_42 without transistor P45 in FIG. 3A, the on-current through the series-coupling of transistors P45 & P41 between nodes nd_41 and nd_42 is smaller. The on-current is smaller because transistors P45 and P41 in the on state represent corresponding resistors R_P45' and R_P41' coupled in series. The sum of the resistances R_P45' and R_P41' is greater than the resistance R_P41'. Despite the smaller on-current through the series-coupling of transistors P45 & P41, the operation of voltage divider 344(1)' of FIG. 3B when transistors P45 and P41 are on remains substantially the same as the operation of voltage divider 344(1) of FIG. 3A when transistor P41 is on.

As compared to the current through transistor P42 when the same is on (on-current) in FIG. 3A, and recalling that transistor P42 is coupled between nodes nd_42 and nd_44 without transistor P46 in FIG. 3A, the on-current through the series-coupling of transistors P42 & P46 between nodes nd_42 and nd_44 is smaller. The on-current is smaller because transistors P42 and P46 in the on state represent corresponding resistors R_P42' and R_P46' coupled in series. The sum of the resistances R_P42' and R_P46' is greater than the resistance R_P42'. Despite the smaller on-current through the series-coupling of transistors P42 & P46, the operation of voltage divider 344(1)' of FIG. 3B when transistors P42 and P46 are on remains substantially the same as the operation of voltage divider 344(1) of FIG. 3A when transistor P42 is on.

In FIG. 3C, the gate terminal of transistor P45 is coupled to the gate terminals of transistors P41 and P42, as called out by reference number 346(1). Also, the gate terminal of transistor P46 is coupled to the gate terminals of transistors P41 and P42, as called out by reference number 346(2). In effect, voltage divide 344(1) of FIG. 3A is expanded to include transistors P45 and P46, resulting in voltage divider 344(1)' in FIG. 3C.

In FIG. 3C, when each of transistors P45 and P41 is turned off, only leakage current flows through the series-coupling of transistors P45 & P41. As compared the leakage current through transistor P41 in FIG. 3A wherein transistor P41 is coupled between nodes nd_41 and nd_42 without transistor P45, the leakage current through the series-coupling of transistors P45 & P41 between nodes nd_41 and nd_42 is smaller. The leakage current is smaller because transistors P45 and P41 in the off state represent corresponding resistors R_P45 and R_P41 coupled in series. The sum of the resistances R_P45 and R_P41 is greater than the resistance R_P41.

In max voltage selector 342C, when each of transistors P46 and P42 is turned off, only leakage current flows through the series-coupling of transistors P46 & P42. As compared the leakage current through transistor P42 in FIG. 3A wherein transistor P42 is coupled between nodes nd_42 and nd_43 without transistor P46, the leakage current through the series-coupling of transistors P46 & P42 between nodes nd_42 and nd_43 is smaller. The leakage current is smaller because transistors P46 and P42 in the off state represent corresponding resistors R_P46 and R_P42 coupled in series. The sum of the resistances R_P46 and R_P42 is greater than the resistance R_P42.

In FIG. 3C, the discussion of operation when transistor P45 is on is substantially the same as presented above in the context of FIG. 3B, and so is omitted here for the sake of brevity. Also in FIG. 3C, the discussion of operation when transistor P46 is on is substantially the same as presented above in the context of FIG. 3B, and so is omitted here for the sake of brevity.

Regarding FIGS. 3A, 3B and 3C, in a circumstance in which VDD1 will always be less than VDD2, max voltage selectors 342A, 342B and 342C can be eliminated and the body-bias terminals which otherwise would be coupled to voltage VPP are instead coupled to voltage VDD2.

Figure 4A:
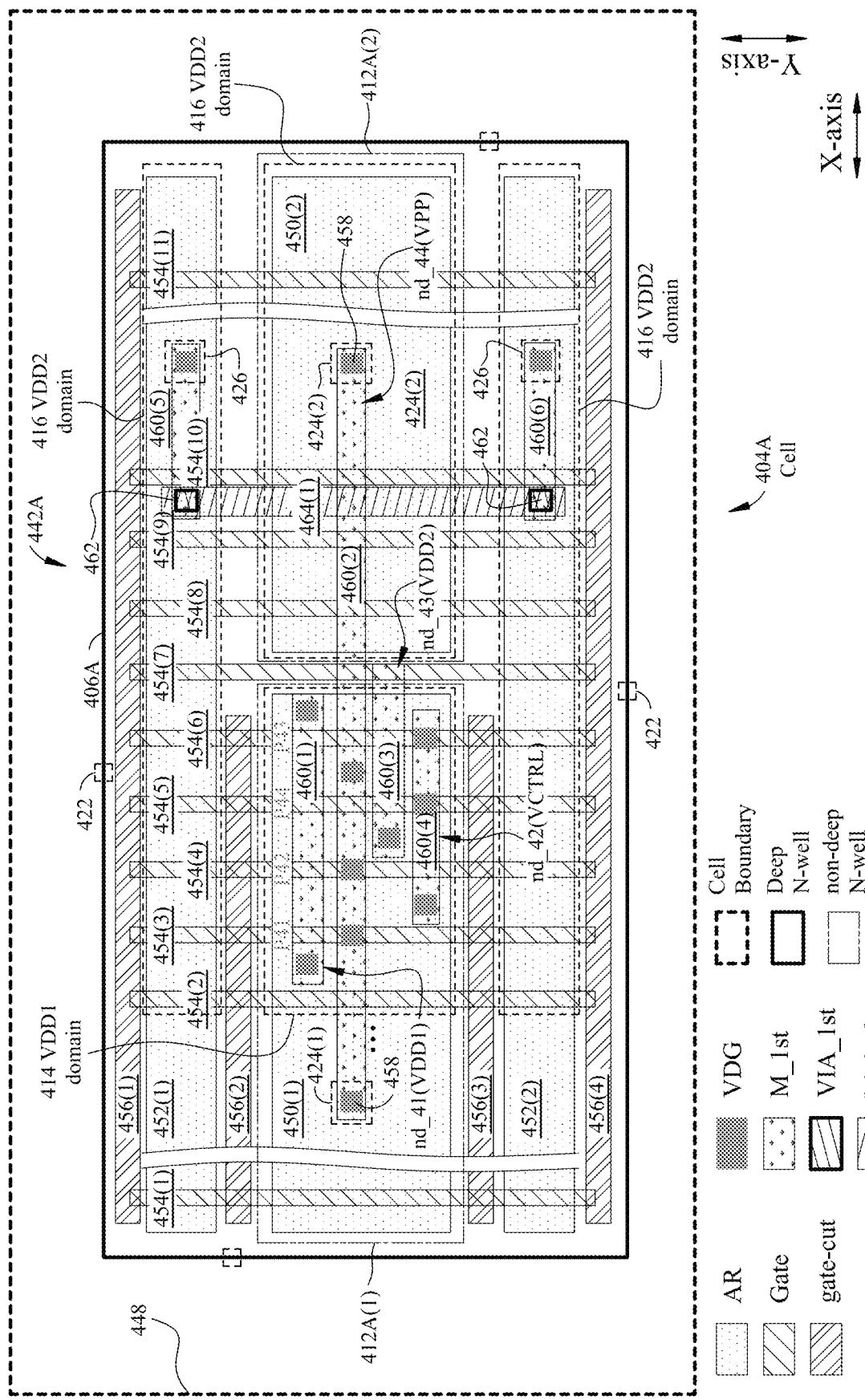
FIGS. 4A, 4B and 4C are corresponding layout diagrams, in accordance with some embodiments.
Figure 4B:
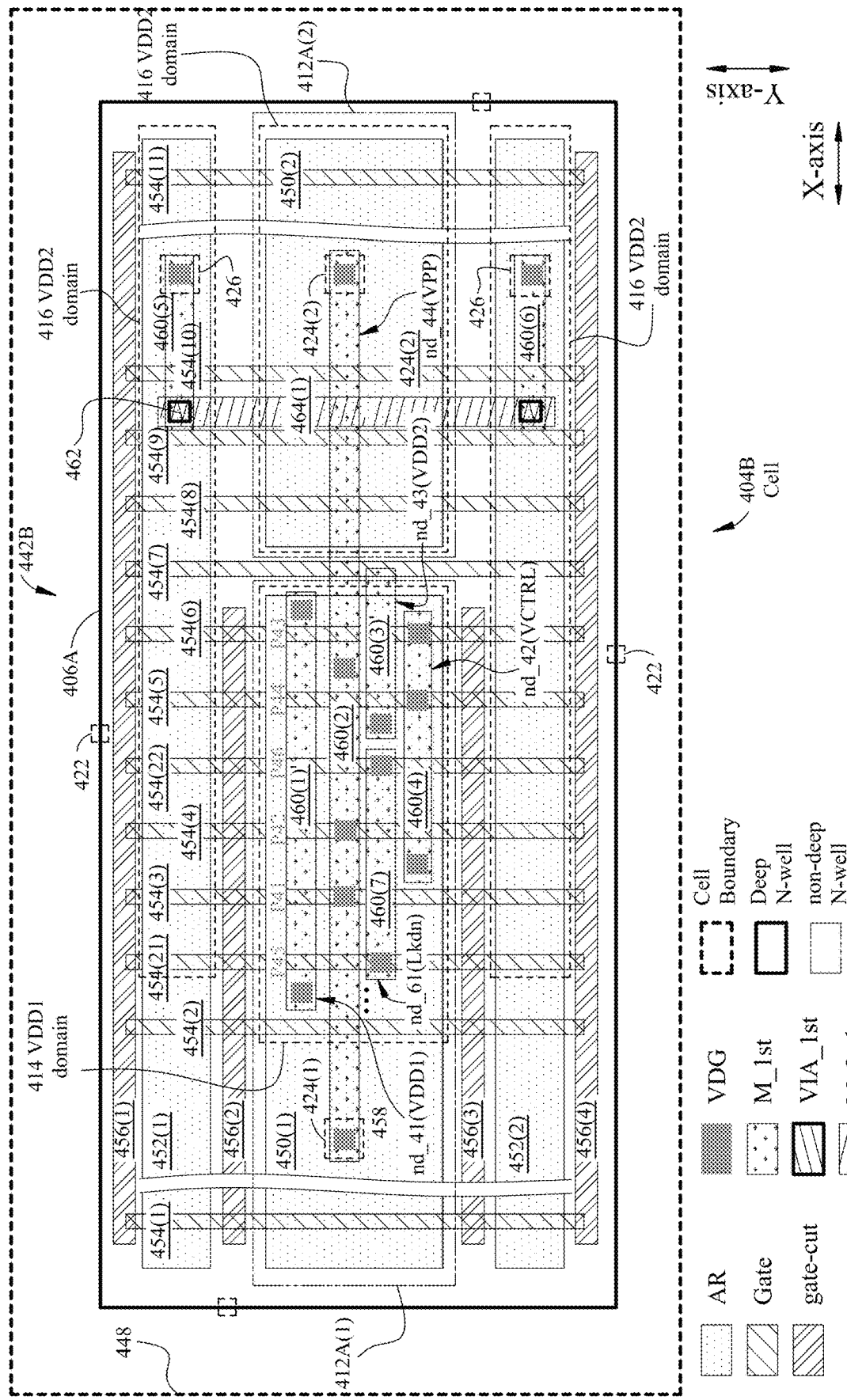
Figure 4C:
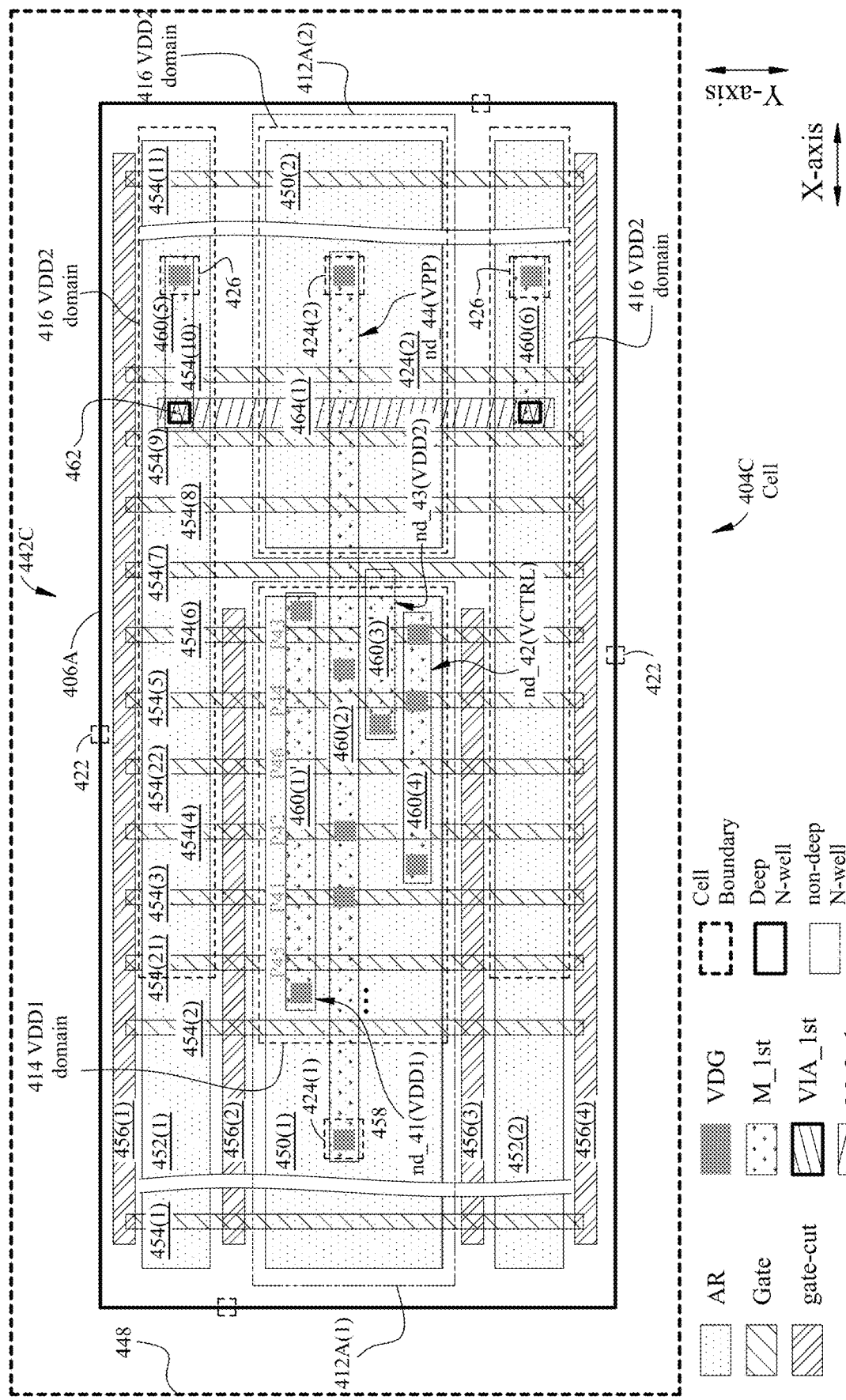

FIGS. 4A, 4B and 4C are corresponding layout diagrams 404A, 404B and 404C, in accordance with some embodiments.

Layout diagrams 404A, 404B and 404C represent corresponding cells 404A, 404B and 404C. Cells 404A, 404B and 404C include layout diagrams 442A, 442B and 442C representing corresponding max voltage selector circuits 342A, 342B and 342C.

As a practical matter, semiconductor devices that include cell regions representing cells 404A, 404B and 404C are fabricated according to corresponding larger (more comprehensive) layout diagrams (not shown) which include corresponding layout diagrams 404A, 404B and 404C. In general, a layout diagram represents a semiconductor device. Shapes in the layout diagram represent corresponding components in the semiconductor device. The layout diagram per se is a top view. Shapes in the layout diagram are two-dimensional. Each shape in the layout diagram represents, more particularly, a component in a corresponding layer of the corresponding semiconductor device. Typically, the layout diagram represents relative depth by superimposing a second shape on a first shape so that the second shape at least partially overlaps the first shape.

In a context of a more formal nomenclature, elements in max voltage selector circuits 342A, 342B and 342C and/or in cell region 104A of FIG. 1A and/or cell region 204 of FIG. 2 are represented by corresponding patterns (also known as shapes) in corresponding layout diagrams 404A, 404B and 404C. For simplicity of discussion, i.e., as a discussion-expedient, most elements in corresponding layout diagrams 404A, 404B and 442C are referred to as if they are counterpart structures in max voltage selector circuits 342A, 342B and 342C and/or in cell region 104A of FIG. 1A and/or cell region 204 of FIG. 2 rather than patterns/shapes per se.

For example, element 422 in FIGS. 4A-4C is a pattern that represents N+ substrate tap 222 of FIG. 2 but are referred to as an N+ substrate tap rather than as an N+ substrate-tap pattern. Nevertheless, not all of the elements of max voltage selector circuits 342A, 342B and 342C and/or in cell region 104A of FIG. 1A and/or cell region 204 of FIG. 2 which are represented in FIGS. 4A-4C are explicitly discussed herein in terms of semiconductor-device-phraseology. For example, cell region 104A in semiconductor device 100A of FIG. 1A, which corresponds to cell region 204A of FIG. 2, is referred to as corresponding as cells 404A, 404B and 404C of corresponding FIGS. 4A, 4B and 4C, and wherein the abbreviation (cell instead of cell region) reflects the use of layout-diagram phraseology for elements 404A, 404B and 404C of corresponding FIGS. 4A, 4B and 4C. Hereinafter, layout diagrams 404A, 404B and 404C are referred to correspondingly as cells 404A, 404B and 404C. Hereinafter, layout diagrams 442A, 442B and 442C are referred to correspondingly as max voltage selector circuits 442A, 442B and 442C.

In FIGS. 4A-4C, each of cells 404A, 404B and 404C includes a cell boundary 448. Each of max voltage selector circuits 442A, 442B and 442C includes: a deep N-well 406A; non-deep wells 412A(1) and 412A(2); P-type active regions (ARs) 450(1) and 450(2) in corresponding non-deep wells 412A(1) and 412A(2); N-type ARs 452(1) and 452(2); N+ substrate taps 422 for deep N-well 406A; N+ substrate taps 424(1) and 424(2) correspondingly for P-type ARs 452(1) and 452(2) in corresponding non-deep N-wells 412A(1) and 412A(2); P+ substrate taps 426 correspondingly for N-type ARs 452(1) and 452(2); gate segments 454(1)-454(11) representing gate electrodes; cut-gate patterns 456(1)-456(4); via-to-MD/via-to-gate (VDG) structures 458; M_1st segments; VIA_1st vias 462; and an M_2nd segment 464(1).

FIGS. 4A-4C assume that P-type ARs 450(1)-450(2) and N-type ARs 454(1)-452(2) represent active regions which embody fin-FET technology. Accordingly, P-type ARs 450(1)-450(2) and N-type ARs 452(1)-452(2) represent active regions which corresponding P-type fins N-type fins 220. In some embodiments, P-type ARs 450(1)-450(2) and N-type ARs 454(1)-452(2) represent active regions which embody a transistor technology other than fin-FET technology, e.g., planar transistor technology, or the like.

The M_1st segments correspond to conductors included in a first (1st) layer of metallization (M_1st layer) in semiconductor devices based on corresponding larger layout diagrams which correspondingly include cells 404A, 404B and 404C. M_2nd segment 464(1) corresponds to a conductor included in a second (2nd) layer of metallization, M_2nd, in such semiconductor devices. VIA_1st vias 458 correspond to via structures in a first level of interconnect structures (first level of interconnection), V_1st, between the M_1st and M_2nd layers, in such semiconductor devices. In some embodiments, depending upon the numbering convention of the corresponding process node by which such semiconductor devices are fabricated, the M_1st layer is either metallization layer zero, M0, or metallization layer one, M1, and correspondingly the V_1st layer is either VIA0 or VIA1, and correspondingly the M_2nd layer is either M1 or M2. In some embodiments, the M_1st layer is the first layer of metallization above a transistor layer in which transistor components are formed. In some embodiments, the transistor layer (not shown) includes: a sub-layer (not shown) corresponding to the substrate, e.g., substrate 202A; an MD sub-layer (not shown) that includes gate segments 454(1)-454(11) and metal-to-source/drain (MD) contact structures for coupling source/drain (S/D) regions (not shown) in active regions to corresponding VDG structures 458; and a VDG layer (not shown) that includes VDG structures 458 for corresponding connecting MD contact structures and gate segments 454(1)-454(11) to corresponding ones M_1st segments. In some embodiments, gate segments 454(7) is an isolation dummy gate.

In some embodiments, an isolation dummy gate occupies the intervening region. In some embodiments, the semiconductor device includes a lower-leakage (LL) section. In some embodiments, the semiconductor device includes a higher-leakage (HL) section. In some embodiments: the first active region is substantially within the LL section; and, relative to the Y-axis, the first active region is configured with a height that facilitates current leakage being below a predetermined threshold. In some embodiments: the second active region is substantially within the higher-leakage section; and, relative to the Y-axis, the second active region is configured with a height that is greater than the height of the first active region that facilitates higher performance, e.g., switching speeds at or exceeding a predetermined threshold. In some embodiments, a second isolation dummy gate separates one or more first active regions into a first portion and a second portion. In some embodiments, a third isolation dummy gate separates one or more second active regions into a first portion and a second portion.

In some embodiments, an isolation dummy gate is a dielectric structure that includes one or more dielectric materials and functions as an electrical isolation structure. Accordingly, an isolation dummy gate is not a structure that is electrically conductive and thus does not function, e.g., as an active gate of a transistor. An isolation dummy gate includes one or more dielectric materials and functions as an electrical isolation structure. In some embodiments, an isolation dummy gate is based on a gate structure as a precursor. In some embodiments, a dummy gate structure includes a gate conductor, a gate-insulator layer, (optionally) one or more spacers, or the like. In some embodiments, an isolation dummy gate is formed by first forming a gate structure, e.g., a dummy gate structure, sacrificing/removing (e.g., etching) the gate conductor of the gate structure to form a trench, (optionally) removing a portion of a substrate that previously had been under the gate conductor to deepen the trench, and then filling the trench with one or more dielectric materials such that the physical dimensions of the resultant electrical isolation structure, i.e., the isolation dummy gate, are similar to the dimensions of the dummy gate conductor which was sacrificed, namely the gate conductor or the combination of the gate conductor and the portion of the substrate. In some embodiments, an isolation dummy gate is a dielectric feature that includes one or more dielectric materials (e.g., oxide, nitride, oxynitride, or other suitable materials), and functions as an isolation feature. In some embodiments, an isolation dummy gate is a continuous polysilicon on oxide diffusion (OD) edge structure, and is referred to as a CPODE structure.

In FIG. 4A, transistor P41 is formed in AR 450(1) with a gate terminal represented by the corresponding portion of gate segment 454(3), a first S/D region between corresponding portions of gate segments 454(2) and 454(3), and a second S/D region between corresponding portions of gate segments 454(3) and 454(4). Transistor P42 is formed in AR 450(1) with a gate terminal represented by the corresponding portion of gate segment 454(4), a first S/D region between corresponding portions of gate segments 454(3) and 454(4), and a second S/D region between corresponding portions of gate segments 454(4) and 454(5). The second S/D region of transistor P41 is the same portion of P-type AR 450(1) as the first S/D region of transistor P42. Transistor P44 is formed in AR 450(1) with a gate terminal represented by the corresponding portion of gate segment 454(5), a first S/D region between corresponding portions of gate segments 454(4) and 454(5), and a second S/D region between corresponding portions of gate segments 454(5) and 454(6). The second S/D region of transistor P42 is the same portion of P-type AR 450(1) as the first S/D region of transistor P44. Transistor P43 is formed in P-type AR 450(1) with a gate terminal represented by the corresponding portion of gate segment 454(6), a first S/D region between corresponding portions of gate segments 454(5) and 454(6), and a second S/D region between corresponding portions of gate segments 454(6) and 454(7). The second S/D region of transistor P44 is the same portion of P-type AR 450(1) as the first S/D region of transistor P43.

A portion of P-type AR 450(1) which includes transistors P41-P44 is configured for the first power domain having reference voltage VDD1. N-type AR 452(1) is configured for the first power domain having reference voltage VDD1. Each of P-type AR 450(2) and N-type AR 452(2) is configured for the second power domain having reference voltage VDD2.

In some embodiments, for a given semiconductor device manufactured according to a given semiconductor process technology node, regardless of whether gate conductors in the given semiconductor device corresponding to gate segments 454(1)-454(11) are formed of polysilicon, some embodiments refer to gate segments 454(1)-454(11) poly segments 454(1)-454(11) for the reason of historical convenience, i.e., because gate structures in ICs manufactured according to a predecessor semiconductor process technology node were formed of polysilicon. In such embodiments, similarly, cut-gate patterns 456(1)-456(4) are referred to as cut-poly (CPO) patterns 456(1)-456(4) for the reason of historical convenience.

In FIG. 4A, the M_1st segments include M_1st segments 460(1)-460(6). M_1st segment 460(1) couples together the first S/D region of transistor P41 and the second S/D region of transistor P43 through corresponding VGD structures 458 and corresponding MD contact structures (not shown). M_1st segment 460(1) corresponds to node nd_41 and is designated to receive voltage VDD1.

M_1st segment 460(2) couples together the portion of gate segment 454(3) corresponding to transistor P41, the portion of gate segment 454(4) corresponding to transistor P42, the second S/D region of transistor P44, and the first S/D region of transistor P43 through corresponding VGD structures 458 and corresponding MD contact structures (not shown). M_1st segment 460(2) corresponds to node nd_43 and is designated to receive voltage VPP. M_1st segment 460(2) additionally couples N+ substrate taps 424(1) and 424(2), and thereby corresponding P-type ARs 450(1) and 450(2), to voltage VPP through corresponding VGD structures 458 and corresponding MD contact structures (not shown).

M_1st segment 460(3) couples the second S/D region of transistor P42 and the first S/D region of transistor P44 through a corresponding VGD structure 458 and a corresponding MD contact structure (not shown). M_1st segment 460(3) corresponds to node nd_43 and is designated to receive voltage VDD2.

M_1st segment 460(4) couples together the portion of gate segment 454(5) corresponding to transistor P44, the portion of gate segment 454(6) corresponding to transistor P43, the second S/D region of transistor P41, and the first S/D region of transistor P42 through corresponding VGD structures 458 and corresponding MD contact structures (not shown). M_1st segment 460(4) corresponds to node nd_42 and is designated to receive voltage VCTRL.

M_2nd segment 464(1) couples together M_1st segments 460(5) and 460(6) through corresponding VIA_1st vias 462. M_1st segments 460(5) and 460(6) couple corresponding P+ substrate taps 426 to VSS through corresponding VGD structures 458 and corresponding MD contact structures (not shown).

In each of FIGS. 4B-4C, in addition to including PMOS transistors P41, P42, P43 and P44, each of max voltage selectors 442B and 442C further includes PMOS transistors P45 and P46. Accordingly, each of cells 404B and 404C further includes gate segments 454(21) and 454(22). Gate segment 454(21) is inserted between gate segments 454(2) and 454(3). Gate segment 454(22) is inserted between gate segments 454(4) and 454(5).

In each of FIGS. 4B-4C, differences of transistors P41-P44 with respect to FIG. 4A are as follows. Regarding transistor P41, the first S/D region is between corresponding portions of gate segments 454(21) and 454(3). Regarding transistor P42, the second S/D region is between corresponding portions of gate segments 454(4) and 454(22). Regarding transistor P44, the first S/D region is between corresponding portions of gate segments 454(22) and 454(5).

Transistor P45 is formed in P-type AR 450(1) with a gate terminal represented by the corresponding portion of gate segment 454(21), a first S/D region between corresponding portions of gate segments 454(2) and 454(21), and a second S/D region between corresponding portions of gate segments 454(21) and 454(3). The second S/D region of transistor P45 is the same portion of P-type AR 450(1) as the first S/D region of transistor P41.

In each of FIGS. 4B-4C, transistor P46 is formed in P-type AR 450(1) with a gate terminal represented by the corresponding portion of gate segment 454(22), a first S/D region between corresponding portions of gate segments 454(4) and 454(22), and a second S/D region between corresponding portions of gate segments 454(22) and 454(5). The second S/D region of transistor P42 is the same portion of P-type AR 450(1) as the first S/D region of transistor P46. The second S/D region of transistor P46 is the same portion of P-type AR 450(1) as the first S/D region of transistor P44.

Differences between FIG. 4B and FIG. 4A include the following. In FIG. 4B, cell region 404B further includes M_1st segment 460(7), which couples together the portion of gate segment 454(22) corresponding to transistor P46, and the portion of gate segment 454(21) corresponding to transistor P45 through corresponding VGD structures 458 and corresponding MD contact structures (not shown). M_1st segment 460(7) corresponds to node nd_61 and is designated to receive signal Lkdn.

Differences between FIG. 4C and FIG. 4A include the following. In FIG. 4C, M_1st segment 460(2) additionally couples the portion of gate segment 454(21) corresponding to transistor P45 and the portion of gate segment 454(22) corresponding to transistor P46 to voltage VPP through corresponding VGD structures 458 and corresponding MD contact structures (not shown).

Figure 5:
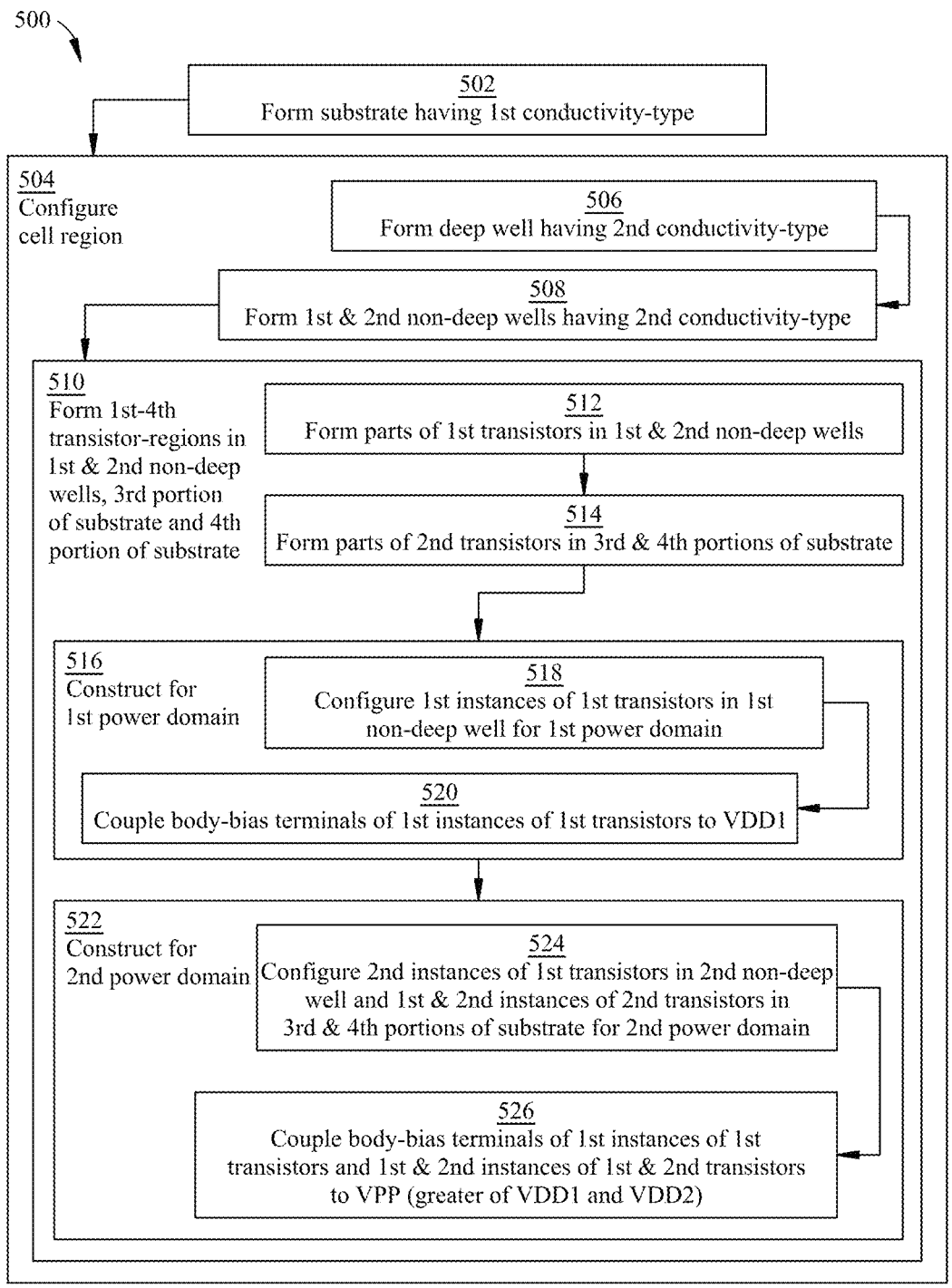
FIG. 5 is a flow diagram of a method, in accordance with some embodiments.

FIG. 5 is a flow diagram 500 of a method of manufacturing a semiconductor device, in accordance with some embodiments.

The method of flow diagram 500 includes blocks 502-526. At block 502, a substrate is formed which has a first conductivity type. In some embodiments, the first conductivity type is P-type. Examples of a P-type substrate include substrates 102A of FIG. 1A, 202A of FIG. 2, or the like. From block 502, flow proceeds to block 504.

At block 504, the cell region is configured. Examples of the cell region include cell region 104A of FIG. 1A, cell region 204A of FIG. 2, cell regions based on cells 404A-404C of corresponding FIGS. 4A-4C, or the like. Block 504 includes blocks 506-510. Flow proceeds in block 504 to block 506.

At block 506, a deep well is formed having a second conductivity. In embodiments for which the first conductivity is P-type, accordingly the second conductivity type is N-type. Examples of the deep well include deep N-wells 106A of FIG. 1A, 206A of FIG. 2, a deep N-well based on N-well pattern 406A of FIGS. 4A-4C, or the like. From block 506, flow proceeds to block 508.

At block 508, first and second non-deep wells having the second conductivity are formed in corresponding first and second transistor-regions. Examples of the first and second non-deep wells include corresponding non-deep N-wells 112A(1) and 112A(2) of FIG. 1A, 212A(1) and 212A(2) of FIG. 2, non-deep wells corresponding to non-deep well patterns 412A(1) and 412A(2) of FIGS. 4A-4C, or the like. The first and second non-deep N-wells are formed in first and second portions of the substrate. Examples of the first and second portions of the substrate correspondingly include first and second portions 103A(1) and 103A(2) of substrate 102A of FIG. 1A, first and second portions 203A(1) and 203A(2) of substrate 202A of FIG. 2, or the like. From block 508, flow proceeds to block 510.

At block 510, first, second, third and fourth transistor-regions are formed correspondingly in the first and second non-deep wells, a third portion of the substrate and a fourth portion of the substrate. Examples of the first and second transistor-regions correspondingly include first and second transistor-regions 108A(1) and 108A(2) of FIG. 1A, first and second 208A(1) and 208A(2) of FIG. 2, or the like. Examples of the third and fourth transistor-regions correspondingly include third and fourth transistor-regions 110(1) and 110A(2) of FIG. 1A, first and second 210A(1) and 210A(2) of FIG. 2, or the like. Examples of the third and fourth portions of the substrate correspondingly include third and fourth portions 103A(3) and 103A(4) of substrate 102A of FIG. 1A, third and fourth portions 203A(3) and 203A(4) of substrate 202A of FIG. 2, or the like.

Block 510 includes blocks 512-514, 516, and 522. Flow proceeds in block 510 to block 512. At block 512, parts of first transistors are correspondingly formed in the first and second non-deep wells. In some embodiments, the first transistors have the first conductivity type. From block 510, flow proceeds to block 514.

At block 514, parts of second transistors are correspondingly formed in the third and fourth portions of the substrate. In some embodiments, the second transistors have the second conductivity-type. From block 514, flow proceeds to block 516.

At block 516, structures are constructed for the first power domain having the first reference voltage. Examples of the first power domain include first power domain 114 having reference voltage VDD1 of FIG. 1A, first power domain 214 having reference voltage VDD1 of FIG. 2, or the like. Block 516 includes blocks 518-520. Flow proceeds in block 516 to block 518.

At block 518, first instances of first transistors in the first non-deep well are configured for the first power domain. Examples of the first instances of the first transistors in the first non-deep well include the first transistors correspondingly in non-deep N-well 112A(1) of FIG. 1A, the first transistors correspondingly in non-deep N-well 212A(1) of FIG. 2, PMOS transistors P1-P3 in FIG. 3A, or the like. From block 518, flow proceeds to block 520.

At block 520, body-bias terminals of the first instances of the first transistors are coupled to the reference voltage of the first power domain, i.e., to VDD1. Examples of the first instances of the first transistors in the first non-deep well include PMOS transistors P1-P3 whose body-bias terminals are coupled to the reference voltage of the first power domain, i.e., to VDD1. From block 520, flow exits block 516 and proceeds to block 522.

At block 522, structures are constructed for the second power domain having the second reference voltage. Examples of the second power domain include second power domain 116 having reference voltage VDD2 of FIG. 1A, second power domain 216 having reference voltage VDD2 of FIG. 2, or the like. Block 522 includes blocks 524-526. Flow proceeds in block 522 to block 524.

At block 524, second instances of the first transistors in the second non-deep well and first and second instances of the second transistors in the third and fourth portions of the substrate are configured for the second power domain. Examples of the second instances of the first transistors in the second non-deep well include the first transistors correspondingly in non-deep N-well 112A(2) of FIG. 1A, the first transistors correspondingly in non-deep N-well 212A(2) of FIG. 2, PMOS transistors P11-P14, P21-P23, P31-P32, and P41-44 in FIG. 3A, PMOS transistors P45-P46 in FIGS. 3B-3C, or the like. From block 518, flow proceeds to block 526.

At block 526, body-bias terminals of the second instances of the first transistors and the first and second instances of the second transistors are coupled to the greater of the reference voltage of the first power domain (VDD1) or the reference voltage of the second power domain (VDD2), i.e., to VPP. Examples of the second instances of the first transistors in the second non-deep well include PMOS transistors P11-P14, P21-P23, P31-P32, and P41-44 in FIG. 3A, PMOS transistors P45-P46 in FIGS. 3B-3C whose body-bias terminals are coupled to VPP, i.e., the grater of the reference voltage of the first power domain (VDD1) or the reference voltage of the second power domain (VDD2).

Regarding block 526, in a circumstance in which VDD1 will always be less than VDD2, the body-bias terminals are coupled to the voltage of the second power domain (VDD2) rather than VPP.

Figure 6:
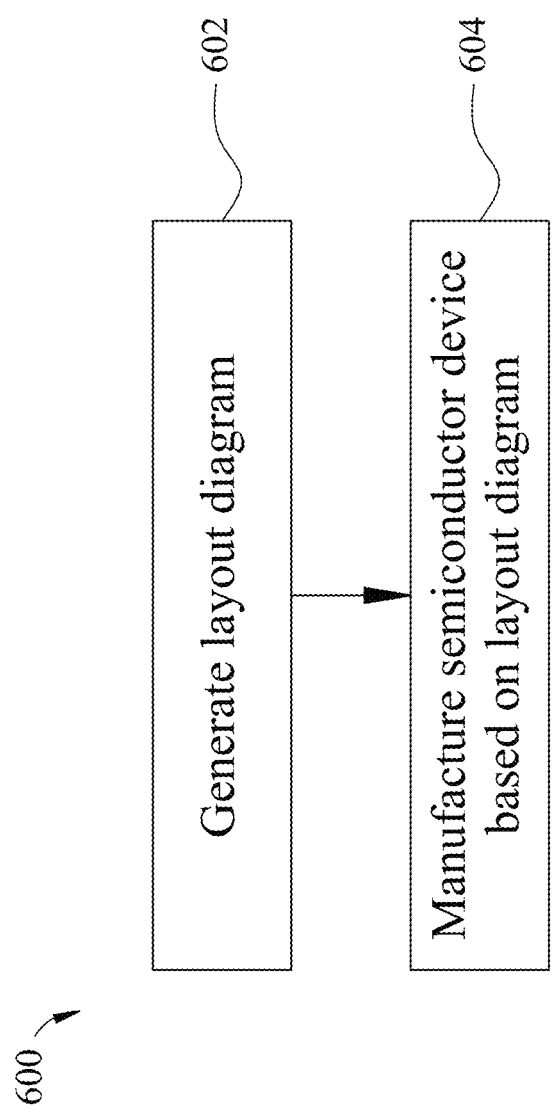
FIG. 6 is a flow diagram of a method, in accordance with some embodiments.

FIG. 6 is a flow diagram 600 of a method of manufacturing a semiconductor device, in accordance with some embodiments.

The method of flow diagram 600 is implementable, for example, using EDA system 700 (FIG. 7, discussed below) and an IC manufacturing system 800 (FIG. 8, discussed below), in accordance with some embodiments. Examples of a semiconductor device which can be manufactured according to the method of flow diagram 600 include semiconductor devices 100A and 100B of corresponding FIGS. 1A and 1B, semiconductor devices corresponding to various ones of the circuit diagrams disclosed herein, semiconductor devices corresponding to various ones of the layout diagrams disclosed herein, or the like.

In FIG. 6, the method of flow diagram 600 includes blocks 602-604. At block 602, a layout diagram is generated which, among other things, includes one or more of layout diagrams disclosed herein, or the like. Block 602 is implementable, for example, using EDA system 700 (FIG. 7, discussed below), in accordance with some embodiments. From block 602, flow proceeds to block 604.

At block 604, based on the layout diagram, at least one of (A) one or more photolithographic exposures are made or (B) one or more semiconductor masks are fabricated or (C) one or more components in a layer of a semiconductor device are fabricated. See discussion below of IC manufacturing system 800 in FIG. 8 below.

Figure 7:
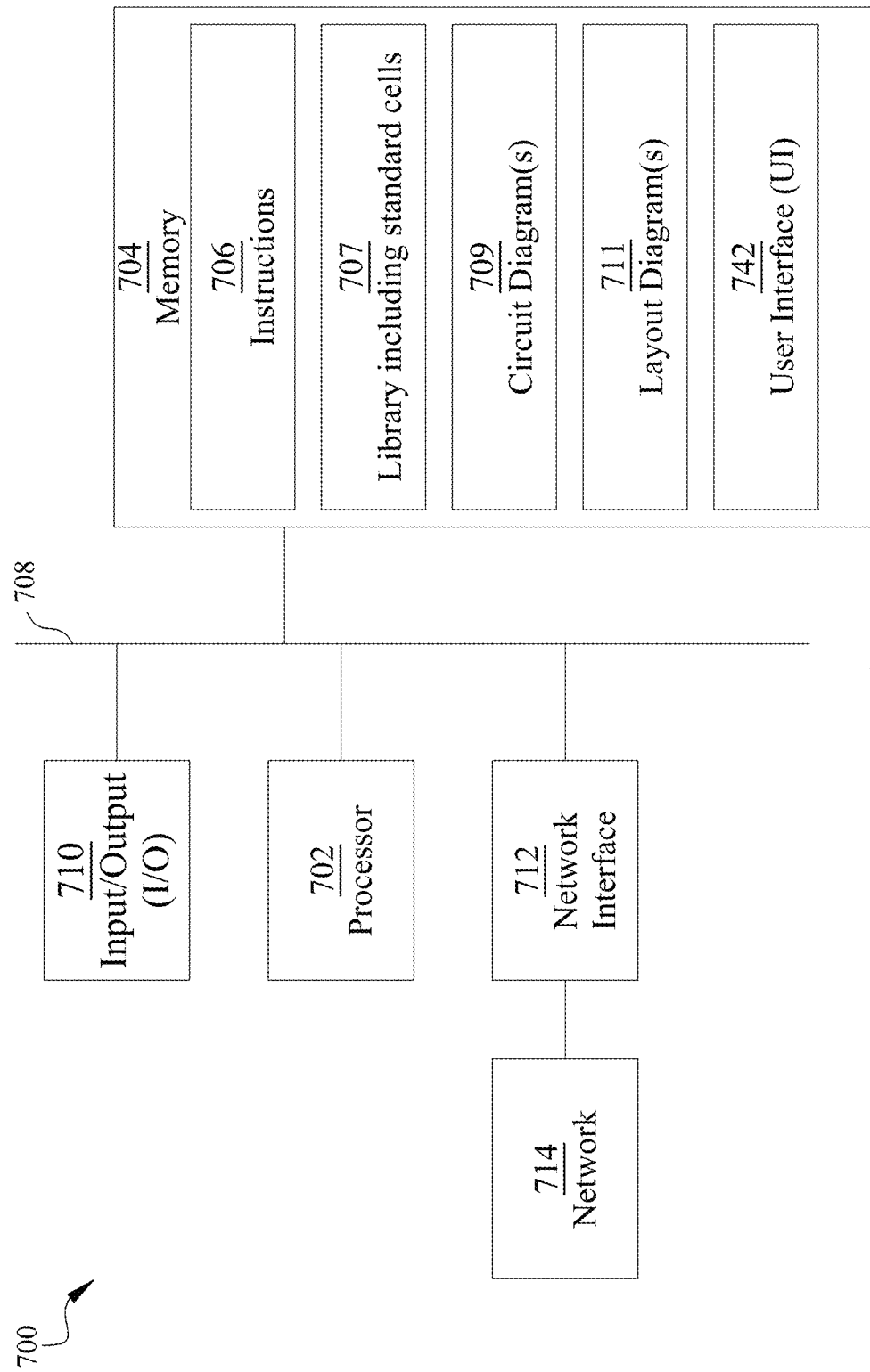
FIG. 7 is a block diagram of an electronic design automation (EDA) system in accordance with some embodiments.

FIG. 7 is a block diagram of an electronic design automation (EDA) system in accordance with some embodiments.

FIG. 7 is a block diagram of an electronic design automation (EDA) system 700 in accordance with some embodiments.

In some embodiments, EDA system 700 includes an APR system. The method of flow diagram 600 of FIG. 6 is implemented, for example, using EDA system 700, in accordance with some embodiments, in order to generate an instance of high voltage analog GR and high voltage analog cell structures 70, 200 and 400, or other suitable cell structures are within the contemplated scope of the present disclosure.

In some embodiments, EDA system 700 is a general-purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of, e.g., the methods of FIGS. 5 and 6, in accordance with one or more embodiments (hereinafter, the noted processes and/or methods). Storage medium 704, amongst other things, stores a library 707 of standard cells that includes cell such as those disclosed herein, or the like, circuit diagrams 709 that include circuit diagrams such as those disclosed herein, or the like, layout diagrams 711 that include layout diagrams such as those disclosed herein, or the like. Processor 702 is electrically coupled to computer-readable storage medium 704 via a bus 708. Processor 702 is further electrically coupled to an I/O interface 710 by bus 708. A network interface 712 is further electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific IC (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 further stores information which facilitates performing a portion or all of the noted processes and/or methods. In one or more embodiments, storage medium 704 stores library 720 of standard cells including such standard cells as disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 further includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
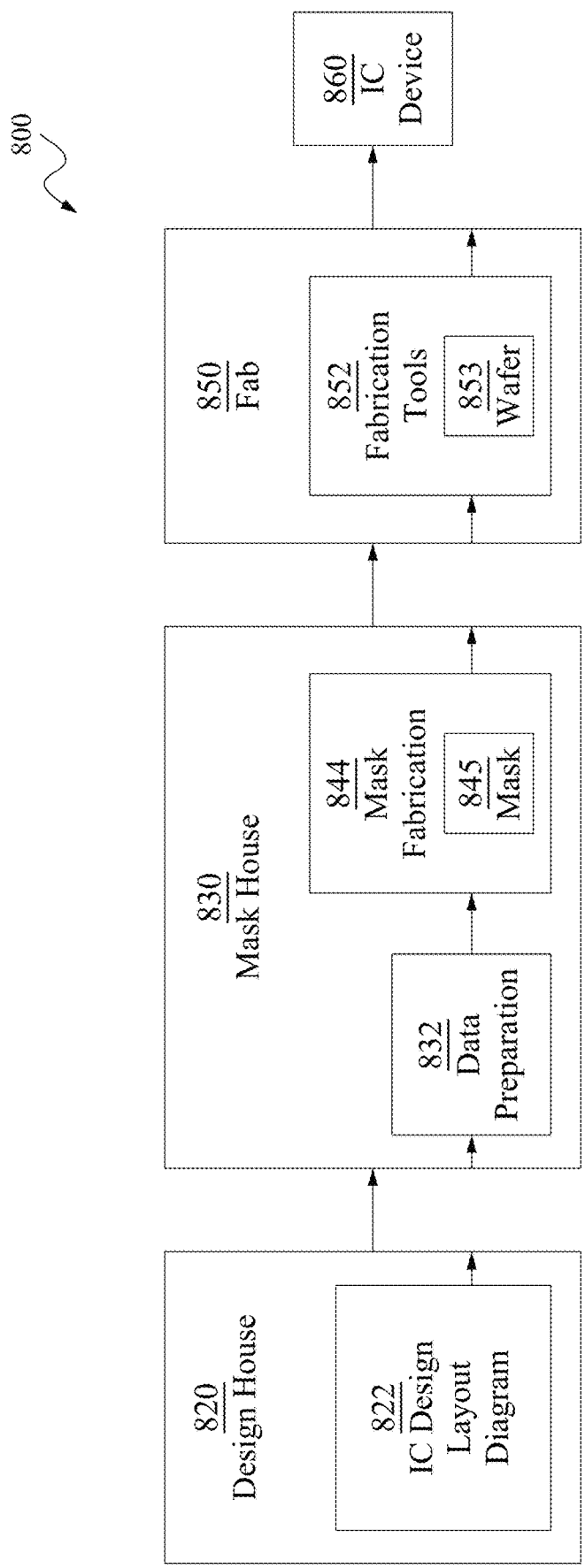
FIG. 8 is a block diagram of an IC manufacturing system, and an IC manufacturing flow associated therewith, in accordance with some embodiments.

FIG. 8 is a block diagram of an IC manufacturing system 800, and an IC manufacturing flow associated therewith, in accordance with some embodiments.

In FIG. 8, IC manufacturing system 800 includes entities, such as a design house 820, a mask house 830, and an IC manufacturer/fabricator ("fab") 840, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout 822. IC design layout 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout 822. The design procedure includes one or more of logic design, physical design or place and route. IC design layout 822 is presented in one or more data files having information of the geometrical patterns. For example, IC design layout 822 is expressed in a GDSII file format or DFII file format.

Mask house 830 includes data preparation 832 and mask fabrication 844. Mask house 830 uses IC design layout 822 to manufacture one or more masks to be used for fabricating the various layers of IC device 860 according to IC design layout 822. Mask house 830 performs mask data preparation 832, where IC design layout 822 is translated into a representative data file ("RDF"). Mask data preparation 832 supplies the RDF to mask fabrication 844. Mask fabrication 844 includes a mask writer. A mask writer converts the RDF to an image on a substrate, such as a mask (reticle) or a semiconductor wafer. The design layout is manipulated by mask data preparation 832 to comply with particular characteristics of the mask writer and/or requirements of IC fab 850. In FIG. 8, mask data preparation 832, mask fabrication 844, and mask 845 are illustrated as separate elements. In some embodiments, mask data preparation 832 and mask fabrication 844 are collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 832 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout 822 to fabricate a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 822.

It is understood that the above description of mask data preparation 832 has been simplified for the purposes of clarity. In some embodiments, data preparation 832 includes additional features such as a logic operation (LOP) to modify the IC design layout according to manufacturing rules. Additionally, the processes applied to IC design layout 822 during data preparation 832 may be executed in a variety of different orders.

After mask data preparation 832 and during mask fabrication 844, a mask 845 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 844 is used in a variety of processes. For example, such a mask(s) is used in an ion implantation process to form various doped regions in the semiconductor wafer, in an etching process to form various etching regions in the semiconductor wafer, and/or in other suitable processes.

IC fab 850 is an IC fabrication business that includes one or more manufacturing facilities for the fabrication of a variety of different IC products. In some embodiments, IC fab 850 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 850 uses the mask (or masks) fabricated by mask house 830 to fabricate IC device 860 using fabrication tools 852. Thus, IC fab 850 at least indirectly uses IC design layout 822 to fabricate IC device 860. In some embodiments, a semiconductor wafer 1942 is fabricated by IC fab 850 using the mask (or masks) to form IC device 860. Semiconductor wafer 1942 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an IC manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a semiconductor device includes a substrate having a first conductivity-type and a cell region. The cell region includes: a deep well having a second conductivity-type; first and second non-deep wells having the second conductivity-type, the first and second non-deep wells being in corresponding first and second portions of the substrate, the first and second portions of the substrate being in the deep well; and first, second, third and fourth transistor-regions. The first and second transistor-regions include first transistors having the first conductivity-type, the first and second transistor-regions being correspondingly in the first and second non-deep wells. The third and fourth transistor-regions including second transistors having the second conductivity-type, the third and fourth transistor-regions being corresponding in third and fourth portions of the substrate, the third and fourth portions of the substrate being in the deep well. The first transistor-region is configured for a first power domain. The second, third and fourth transistor-regions are configured for a second power domain that is different than the first power domain.

In some embodiments, the first conductivity-type is positive-type (P-type); and the second conductivity-type is negative-type (N-type). In some embodiments, the first transistors correspondingly of the first and second transistor-regions and the second transistors correspondingly of the third and fourth transistor-regions define a circuit, the circuit being a level-shifter. In some embodiments, the first power domain has a first reference voltage; the second power domain has a second reference voltage; and body-bias terminals correspondingly of the first transistors in the first transistor-region and body-bias terminals correspondingly of the first transistors in the second transistor-region and the second transistors correspondingly in the third and fourth transistor-regions are coupled to the greater of the first and second reference voltages. In some embodiments, the semiconductor device further includes a maximum voltage selector circuit configured to select the greater of the first and second reference voltages and couple the same to the body-bias terminals correspondingly of the first transistors and the body-bias terminals correspondingly of the second transistors. In some embodiments, the maximum voltage selector circuit includes: first and second active voltage dividers coupled between a first node and a second node, the first and second nodes having correspondingly the first and second reference voltages; the first active voltage divider including a control input configured to receive an output voltage of the second active voltage divider; the first active voltage divider further including an output configured to generate an output voltage; the second active voltage divider including a control input configured to receive the output voltage of the first active voltage divider; the second active voltage divider further including an output configured to generate an output voltage which represents an output voltage of the maximum voltage selector circuit; and the output voltage of the maximum voltage selector being the greater of the first reference voltage and the second reference voltage.

In some embodiments, a method (of forming a semiconductor device) includes forming a substrate having a first conductivity-type, and configuring a cell region in the substrate, the configuring a cell region including: forming a deep well in the substrate, the deep well having, a second conductivity-type; forming first and second non-deep wells in corresponding first and second portions of the substrate, the first and second portions of the substrate being in the deep well and having the second conductivity-type; forming first, second, third and fourth transistor-regions correspondingly in the first non-deep well, the second non-deep well, a third portion of the substrate and a fourth portion of the substrate. The forming first to fourth transistor-regions includes: forming components of first transistors correspondingly in the first and second non-deep wells, the first transistors having the first conductivity-type; forming components of second transistors correspondingly in the third and fourth portions of the substrate, the second transistors having the second conductivity-type; constructing for a first power domain including configuring first instances of the first transistors which are in the first non-deep well for the first power domain; and constructing for a second power domain including configuring second instances of the second transistors which are correspondingly in the second non-deep well and first and second instances of the second transistors which are correspondingly in the third and fourth portions of the substrate for the second power domain.

In some embodiments, the first transistors correspondingly of the first and second transistor-regions and the second transistors correspondingly of the third and fourth transistor-regions define a circuit, the circuit being a level-shifter; the first power domain has a first reference voltage; the second power domain has a second reference voltage; the constructing for a first power domain further includes coupling body-bias terminals correspondingly of the first instances of the first transistors to the first reference voltage, and the constructing for a second power domain further includes coupling body-bias terminals correspondingly of the second instances of the first transistors and the first and second instances of the second transistors to the greater of the first and second reference voltages.

In some embodiments, a maximum voltage selector circuit includes: first and second active voltage dividers coupled between a first node and a second node, the first and second nodes having corresponding first and second reference voltages; the first active voltage divider including a control input configured to receive an output voltage of the second active voltage divider; the first active voltage divider further including an output configured to generate an output voltage; the second active voltage divider including a control input configured to receive the output voltage of the first active voltage divider; the second active voltage divider further including an output configured to generate an output voltage which represents an output voltage of the maximum voltage selector circuit; and the output voltage of the maximum voltage selector being the greater of the first reference voltage and the second reference voltage.

In some embodiments, the first active voltage divider further includes first and second transistors; a first source/drain (S/D) terminal and a second S/D terminal of the first transistor are coupled correspondingly between the first node and the output of the first active voltage divider; and a first S/D terminal and a second S/D terminal of the second transistor are coupled correspondingly being between the output of the first active voltage divider and the second node. In some embodiments, gate terminals of each of the first and second transistors are coupled to the control input of the first active voltage divider. In some embodiments, body-bias terminals of each of the first and second transistors are coupled to the output of the second active voltage divider thereby to receive the output voltage of the maximum voltage selector circuit. In some embodiments, the second active voltage divider further includes third and fourth transistors; a first S/D terminal and a second S/D terminal of the third transistor are coupled correspondingly between the first node and the output of the second active voltage divider; a first S/D terminal and a second S/D terminal of the fourth transistor are coupled correspondingly between the output of the second active voltage divider and the second node; gate terminals of each of the third and fourth transistors are coupled to the control input of the second active voltage divider; and the maximum voltage selector circuit further includes fifth and sixth transistors; a first S/D terminal and a second S/D terminal of the fifth transistor are coupled correspondingly between the first node and a third node; the first S/D terminal of the first transistor is coupled to the third node; a first S/D terminal and a second S/D terminal of the sixth transistor are coupled correspondingly between a fourth node and the second node; and the first S/D terminal of the second transistor is coupled to the fourth node; and gate terminals of each of the fifth and sixth transistors are coupled together. In some embodiments, the gate terminals of each of the fifth and sixth transistors are coupled to a leakage reduction signal. In some embodiments, the gate terminals of each of the fifth and sixth transistors are also coupled to the control input of the first active voltage divider. In some embodiments, each of the first and second transistors is a positive-channel metal-oxide semiconductor field-effect (PMOS) transistor.

In some embodiments, the second active voltage divider further includes third and fourth transistors; a first S/D terminal and a second S/D terminal of the third transistor are coupled correspondingly between the first node and the output of the second active voltage divider; and a first S/D terminal and a second S/D terminal of the fourth transistor are coupled correspondingly between the output of the second active voltage divider and the second node. In some embodiments, gate terminals of each of the third and fourth transistors are coupled to the control input of the second active voltage divider. In some embodiments, body-bias terminals of each of the third and fourth transistors are coupled to the output of the second active voltage divider thereby to receive the output voltage of the maximum voltage selector circuit. In some embodiments, each of the third and fourth transistors is a positive-channel metal-oxide semiconductor field-effect (PMOS) transistor.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A maximum voltage selector circuit comprising:
   first and second active voltage dividers coupled between a first node and a second node, the first and second nodes having corresponding first and second reference voltages;
   the first active voltage divider including a control input configured to receive an output voltage of the second active voltage divider;
   the first active voltage divider further including an output configured to generate an output voltage;
   the second active voltage divider including a control input configured to receive the output voltage of the first active voltage divider;
   the second active voltage divider further including an output configured to generate an output voltage which represents an output voltage of the maximum voltage selector circuit; and
   the output voltage of the maximum voltage selector circuit being the greater of the first reference voltage and the second reference voltage.

2. The maximum voltage selector circuit of claim 1, wherein:
   the first active voltage divider further includes first and second transistors;
   a first source/drain (S/D) terminal and a second S/D terminal of the first transistor are coupled correspondingly between the first node and the output of the first active voltage divider; and
   a first S/D terminal and a second S/D terminal of the second transistor are coupled correspondingly being between the output of the first active voltage divider and the second node.

3. The maximum voltage selector circuit of claim 2, wherein:
   gate terminals of each of the first and second transistors are coupled to the control input of the first active voltage divider.

4. The maximum voltage selector circuit of claim 2, wherein:
   body-bias terminals of each of the first and second transistors are coupled to the output of the second active voltage divider thereby to receive the output voltage of the maximum voltage selector circuit.

5. The maximum voltage selector circuit of claim 2, wherein:
   the second active voltage divider further includes third and fourth transistors;
   a first S/D terminal and a second S/D terminal of the third transistor are coupled correspondingly between the first node and the output of the second active voltage divider;
   a first S/D terminal and a second S/D terminal of the fourth transistor are coupled correspondingly between the output of the second active voltage divider and the second node;
   gate terminals of each of the third and fourth transistors are coupled to the control input of the second active voltage divider; and
   the maximum voltage selector circuit further includes fifth and sixth transistors;
   a first S/D terminal and a second S/D terminal of the fifth transistor are coupled correspondingly between the first node and a third node;
   the first S/D terminal of the first transistor is coupled to the third node;
   a first S/D terminal and a second S/D terminal of the sixth transistor are coupled correspondingly between a fourth node and the second node; and
   the first S/D terminal of the second transistor is coupled to the fourth node; and
   gate terminals of each of the fifth and sixth transistors are coupled together.

6. The maximum voltage selector circuit of claim 5, wherein:
the gate terminals of each of the fifth and sixth transistors are coupled to a leakage reduction signal.

7. The maximum voltage selector circuit of claim 6, wherein:
the gate terminals of each of the fifth and sixth transistors are also coupled to the control input of the first active voltage divider.

8. The maximum voltage selector circuit of claim 2, wherein:
each of the first and second transistors is a positive-channel metal-oxide semiconductor field-effect (PMOS) transistor.

9. The maximum voltage selector circuit of claim 1, wherein:
the second active voltage divider further includes third and fourth transistors;
a first source/drain (S/D) terminal and a second S/D terminal of the third transistor are coupled correspondingly between the first node and the output of the second active voltage divider; and
a first S/D terminal and a second S/D terminal of the fourth transistor are coupled correspondingly between the output of the second active voltage divider and the second node.

10. The maximum voltage selector circuit of claim 9, wherein:
gate terminals of each of the third and fourth transistors are coupled to the control input of the second active voltage divider.

11. The maximum voltage selector circuit of claim 9, wherein:
body-bias terminals of each of the third and fourth transistors are coupled to the output of the second active voltage divider thereby to receive the output voltage of the maximum voltage selector circuit.

12. The maximum voltage selector circuit of claim 9, wherein:
each of the third and fourth transistors is a positive-channel metal-oxide semiconductor field-effect (PMOS) transistor.

13. A maximum voltage selector circuit comprising:
first and second active voltage dividers coupled between a first node and a second node, the first and second nodes having corresponding first and second reference voltages;
the first active voltage divider including a control input configured to receive an output voltage of the second active voltage divider;
the first active voltage divider further including an output configured to generate an output voltage;
the second active voltage divider including a control input configured to receive the output voltage of the first active voltage divider;
the second active voltage divider further including an output configured to generate an output voltage which represents an output voltage of the maximum voltage selector circuit;
the first active voltage divider further including first and second transistors;
a first source/drain (S/D) terminal and a second S/D terminal of the first transistor being coupled correspondingly between the first node and the output of the first active voltage divider;
a first S/D terminal and a second S/D terminal of the second transistor being coupled correspondingly being between the output of the first active voltage divider and the second node; and
the output voltage of the maximum voltage selector circuit being the greater of the first reference voltage and the second reference voltage.

14. The maximum voltage selector circuit of claim 13, wherein:
gate terminals of each of the first and second transistors are coupled to the control input of the first active voltage divider.

15. The maximum voltage selector circuit of claim 13, wherein:
body-bias terminals of each of the first and second transistors are coupled to the output of the second active voltage divider thereby to receive the output voltage of the maximum voltage selector circuit.

16. The maximum voltage selector circuit of claim 13, wherein:
the second active voltage divider further includes third and fourth transistors;
a first S/D terminal and a second S/D terminal of the third transistor are coupled correspondingly between the first node and the output of the second active voltage divider;
a first S/D terminal and a second S/D terminal of the fourth transistor are coupled correspondingly between the output of the second active voltage divider and the second node;
gate terminals of each of the third and fourth transistors are coupled to the control input of the second active voltage divider; and
the maximum voltage selector circuit further includes fifth and sixth transistors;
a first S/D terminal and a second S/D terminal of the fifth transistor are coupled correspondingly between the first node and a third node;
the first S/D terminal of the first transistor is coupled to the third node;
a first S/D terminal and a second S/D terminal of the sixth transistor are coupled correspondingly between a fourth node and the second node; and
the first S/D terminal of the second transistor is coupled to the fourth node; and
gate terminals of each of the fifth and sixth transistors are coupled together.

17. A maximum voltage selector circuit comprising:
first and second active voltage dividers coupled between a first node and a second node, the first and second nodes having corresponding first and second reference voltages;
the first active voltage divider including a control input configured to receive an output voltage of the second active voltage divider;
the first active voltage divider further including an output configured to generate an output voltage;
the second active voltage divider including a control input configured to receive the output voltage of the first active voltage divider;
the second active voltage divider further including an output configured to generate an output voltage which represents an output voltage of the maximum voltage selector circuit; and
the second active voltage divider further including third and fourth transistors;

a first source/drain (S/D) terminal and a second S/D terminal of the third transistor being coupled correspondingly between the first node and the output of the second active voltage divider;

a first S/D terminal and a second S/D terminal of the fourth transistor being coupled correspondingly between the output of the second active voltage divider and the second node; and the output voltage of the maximum voltage selector circuit being the greater of the first reference voltage and the second reference voltage.

18. The maximum voltage selector circuit of claim 17, wherein:

gate terminals of each of the third and fourth transistors are coupled to the control input of the second active voltage divider.

19. The maximum voltage selector circuit of claim 17, wherein:

body-bias terminals of each of the third and fourth transistors are coupled to the output of the second active voltage divider thereby to receive the output voltage of the maximum voltage selector circuit.

20. The maximum voltage selector circuit of claim 17, wherein:

each of the third and fourth transistors is a positive-channel metal-oxide semiconductor field-effect (PMOS) transistor.

\* \* \* \* \*